US010136510B2

(12) United States Patent
Nagai et al.

(10) Patent No.: US 10,136,510 B2
(45) Date of Patent: Nov. 20, 2018

(54) EXTREME ULTRAVIOLET LIGHT GENERATION DEVICE

(71) Applicant: Gigaphoton Inc., Tochigi (JP)

(72) Inventors: Shinji Nagai, Oyama (JP); Georg Soumagne, Oyama (JP); Toshihiro Nishisaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/583,001

(22) Filed: May 1, 2017

(65) Prior Publication Data

US 2017/0238407 A1    Aug. 17, 2017

Related U.S. Application Data

(63) Continuation of application No. PCT/JP2014/083393, filed on Dec. 17, 2014.

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01); *G03F 7/70175* (2013.01); *G03F 7/70916* (2013.01)

(58) Field of Classification Search
USPC ..................................................... 250/504 R
See application file for complete search history.

(56) References Cited

U.S. PATENT DOCUMENTS 7,453,077 B2 * 11/2008 Bowering .............. H05G 2/003
                                                          250/396 R
7,999,241 B2 *  8/2011 Nagai .................. G03F 7/70033
                                                          250/423 R
(Continued)

FOREIGN PATENT DOCUMENTS

JP    2008-277481 A    11/2008
JP    2010-080941 A     4/2010
(Continued)

OTHER PUBLICATIONS

International Preliminary Report on Patentability (IPRP) with Written Opinion (PCT-ISA-237), from parent application PCT/JP2014/083393, dated Jun. 20, 2017, 7 pp.
(Continued)

*Primary Examiner* — Phillip A Johnston
(74) *Attorney, Agent, or Firm* — Studebaker & Brackett PC

(57) ABSTRACT

An extreme ultraviolet light generation device may include a chamber in which extreme ultraviolet light is generated from plasma, the plasma generated by irradiation of a target supplied in a plasma generation region inside of the chamber with laser light; a condenser mirror collecting the extreme ultraviolet light and guiding it to outside of the chamber; a first etching gas supply unit blowing an etching gas to a reflective surface of the condenser mirror and the plasma generation region; a magnet forming a magnetic field in the chamber; a port that intersects a central axis of the magnetic field and that takes in suspended substances generated in the chamber; and an ejection path that is in communication with the port and that ejects the suspended substances taken from the port to the outside of the chamber.

14 Claims, 23 Drawing Sheets

(56) References Cited

U.S. PATENT DOCUMENTS

| | | | |
|---|---|---|---|
| 8,212,228 B2* | 7/2012 | Abe | G03F 7/70033 250/493.1 |
| 8,530,869 B2* | 9/2013 | Nagai | G03F 7/70033 250/365 |
| 2009/0261277 A1 | 10/2009 | Soumagne et al. | |
| 2010/0051832 A1 | 3/2010 | Nishisaka et al. | |
| 2010/0090132 A1 | 4/2010 | Endo et al. | |
| 2010/0140514 A1 | 6/2010 | Bykanov et al. | |
| 2010/0213395 A1 | 8/2010 | Ueno et al. | |
| 2012/0223257 A1 | 9/2012 | Nagai et al. | |
| 2013/0161540 A1 | 6/2013 | Nagai et al. | |
| 2016/0209753 A1* | 7/2016 | Zhao | G03F 7/70033 |

FOREIGN PATENT DOCUMENTS

| | | |
|---|---|---|
| JP | 2010-098299 A | 4/2010 |
| JP | 2010-171405 A | 8/2010 |
| JP | 5108367 B2 | 12/2012 |
| JP | 2013-004369 A | 1/2013 |
| JP | 2013-135033 A | 7/2013 |
| JP | 5312837 B2 | 10/2013 |
| WO | 2016/006100 A1 | 1/2016 |

OTHER PUBLICATIONS

International Search Report issued in PCT/JP2014/083393; dated Mar. 10, 2015.

* cited by examiner

A-A SECTION

AB-AB SECTION

AC-AC SECTION

AD-AD SECTION

AE-AE SECTION

AF-AF SECTION

AG-AG SECTION

B-B SECTION

BA-BA SECTION

BB-BB SECTION

BC-BC SECTION

C-C SECTION

D-D SECTION

DA-DA SECTION

DB-DB SECTION

DC-DC SECTION ental field forming device and
EXTREME ULTRAVIOLET LIGHT GENERATION DEVICE

CROSS-REFERENCE TO RELATED APPLICATIONS

The present application is a continuation application of International Application No. PCT/JP2014/083393 filed on Dec. 17, 2014. The content of the application is incorporated herein by reference in its entirety.

BACKGROUND

1. Technical Field

The present disclosure relates to a device for generating an extreme ultraviolet (EUV) light.

2. Related Art

In recent years, as semiconductor processes are moved to finer design rules, transfer patterns for photolithography in semiconductor processes have been rapidly shifted to finer designs. In the next generation, fine patterning of 45 nm-70 nm or fine patterning of 32 nm or less will be required. To meet the requirement for fine patterning of 32 nm or less, for example, the development of an exposure device has been expected which is an extreme ultraviolet (EUV) light generation device for generating extreme ultraviolet (EUV) light of a wavelength of about 13 nm combined with a reduced projection reflective optics.

The following three devices have been proposed as EUV light generation devices: laser produced plasma (LPP) devices which use plasma generated by irradiation of targets with laser light, discharge produced plasma (DPP) devices which use plasma generated by discharge, and synchrotron radiation (SR) devices which use synchrotron orbital radiation.

CITATION LIST

Patent Literature

Patent Literature 1: Japanese Patent No. 5108367
Patent Literature 2: Japanese Patent No. 5312837
Patent Literature 3: Japanese Patent Application Laid-Open No. 2010-171405
Patent Literature 4: U.S. Patent Application Publication No. 2010/0140514
Patent Literature 5: International Application No. PCT/JP2014/068582

SUMMARY

An extreme ultraviolet light generation device related to one aspect of the present disclosure may include a chamber, a condenser mirror, a first etching gas supply unit, magnets, a port, an ejection path and a transfer mechanism. In the chamber, extreme ultraviolet light may be generated from plasma that has been generated by irradiation of a target supplied in a plasma generation region inside of the chamber with laser light. The condenser mirror may be configured to collect the extreme ultraviolet light generated in the chamber and guiding it to outside of the chamber. The first etching gas supply unit may be configured to blow an etching gas to the reflective surface of the condenser mirror and the plasma generation region. The magnets may be disposed outside of the chamber and are configured to form a magnetic field in the chamber. The port may be provided in the inner wall of the chamber, intersect a central axis of the magnetic field and be configured to take in suspended substances generated in the chamber. The ejection path may be in communication with the port and configured to eject the taken suspended substances from the port to the outside of the chamber. The transfer mechanism may be configured to move the chamber and the ejection path away from the magnets.

BRIEF DESCRIPTION OF THE DRAWINGS

Embodiments of the present disclosure will now be described with reference to the attached drawings as illustrative only.

EMBODIMENTS

Figure 1:
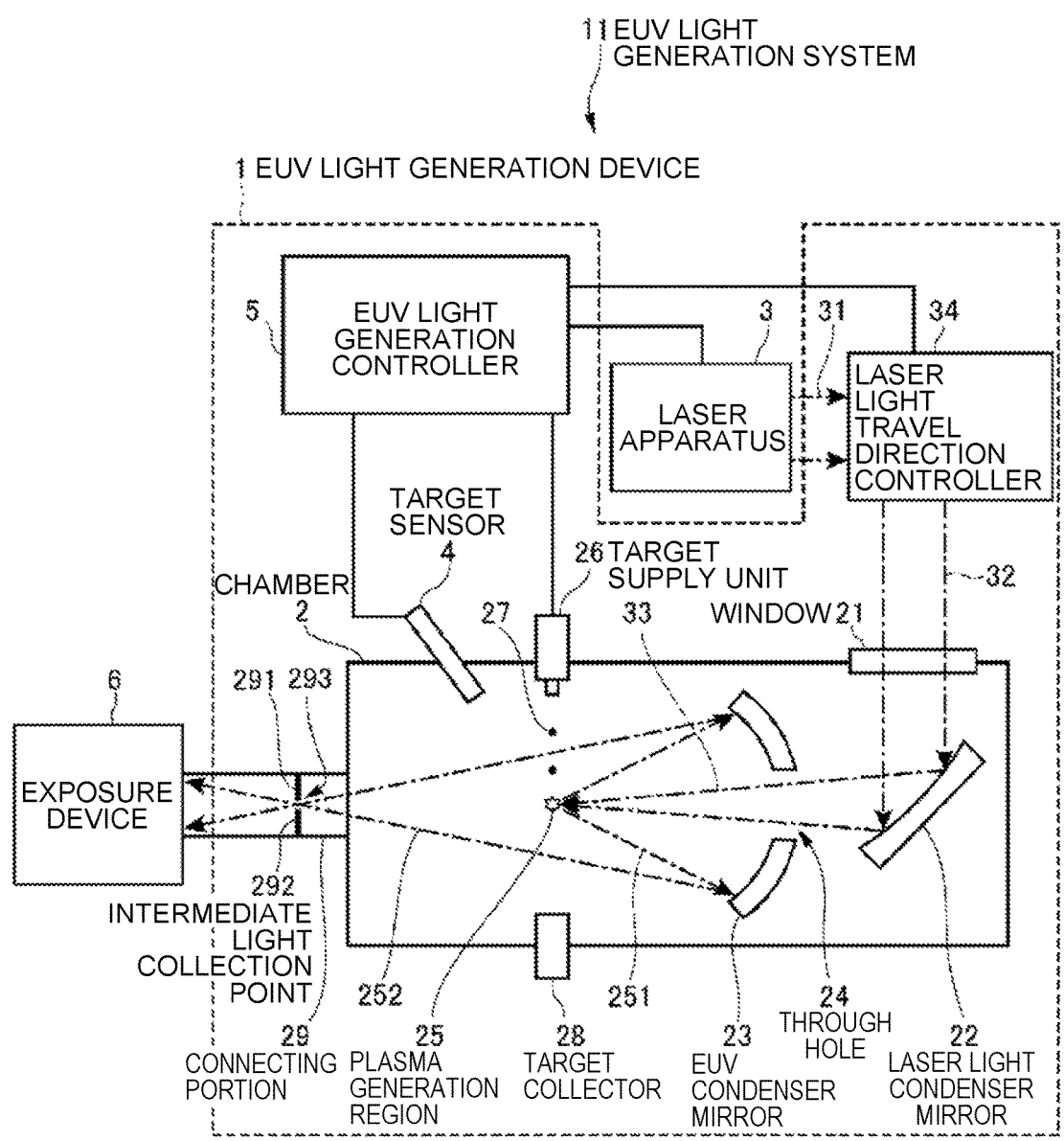
FIG. 1 schematically illustrates a configuration of an illustrative LPP EUV light generation system.

Contents
1. Overview
2. Terms
3. General description of EUV light generation system
    3.1 Configuration
    3.2 Operation
4. EUV light generation device including magnetic field forming device and ion catcher
    4.1 Configuration
    4.2 Operation
    4.3 Effect
5. Problem to be solved
6. Ports and ejection paths included in EUV light generation device according to first embodiment
    6.1 Configuration
    6.2 Operation
    6.3 Effect
7. Ports and ejection path included in EUV light generation device according to Modification 1 of first embodiment
    7.1 Configuration
    7.2 Effect
8. Ports and ejection paths included in EUV light generation device according to Modification 2 of first embodiment
    8.1 Configuration
    8.2 Effect
9. Ports and ejection paths included in EUV light generation device according to Modification 3 of first embodiment
    9.1 Configuration
    9.2 Effect
10. Ports and ejection paths included in EUV light generation device according to Modification 4 of first embodiment
    10.1 Configuration
    10.2 Effect
11. Ports and ejection paths included in EUV light generation device according to Modification 5 of first embodiment
    11.1 Configuration
    11.2 Operation and effect
12. Ports and ejection paths included in EUV light generation device according to Modification 6 of first embodiment
    12.1 Configuration
    12.2 Operation and effect
13. Port and ejection path included in EUV light generation device according to second embodiment
    13.1 Configuration
    13.2 Effect
14. Ports and ejection path included in EUV light generation device according to modification of second embodiment
    14.1 Configuration
    14.2 Effect
15. Port and ejection path included in EUV light generation device according to third embodiment
    15.1 Configuration
    15.2 Operation
    15.3 Effect
16. Ports and ejection paths included in EUV light generation device according to fourth embodiment
    16.1 Configuration
    16.2 Operation
    16.3 Effect
17. Ports and ejection paths included in EUV light generation device according to Modification 1 of fourth embodiment
    17.1 Configuration
    17.2 Effect
18. Ports and ejection paths included in EUV light generation device according to Modification 2 of fourth embodiment
    18.1 Configuration
    18.2 Effect
19. Ports and ejection path included in EUV light generation device according to Modification 3 of fourth embodiment
    19.1 Configuration
    19.2 Effect
20. Ports and ejection path included in EUV light generation device according to Modification 4 of fourth embodiment
    20.1 Configuration
    20.2 Effect Embodiments of the present disclosure will now be described in detail with reference to the drawings. The embodiments below are to be taken as merely examples of the present disclosure and do not limit the scope of the present disclosure. In addition, not all the configuration and the operation described in each embodiment are not necessarily essential to the configuration and the operation of the present disclosure. It should be noted that the same components are denoted by the same reference numeral and overlaps between their descriptions will be omitted.

[1. Overview]

The present disclosure discloses the following embodiments as illustrative only.

An EUV light generation device 1 according to the present disclosure may include a chamber 2 in which extreme ultraviolet light 252 is generated from plasma that has been generated by irradiation of a target 27 supplied in a plasma generation region 25 inside of the chamber 2 with laser light 33; a condenser mirror 23 that is configured to collect the extreme ultraviolet light 252 generated in the chamber 2 and guide it to outside of the chamber 2; a first etching gas supply unit that is configured to blow an etching gas X to the reflective surface of the condenser mirror 23 and the plasma generation region 25; magnets 9a and 9b that are disposed outside of the chamber 2 and generate a magnetic field in the chamber 2; a port 80 that is provided on an inner surface of the chamber 2, intersect a central axis of the magnetic field and is configured to take in suspended substances P generated in the chamber 2; an ejection path 81 that is in communication with the port 80 and is configured to eject the taken suspended substances P from the port 80 to the outside of the chamber 2; and a transfer mechanism R that is configured to move the chamber 2 and the ejection path 81 away from the magnets 9a and 9b.

In the EUV light generation device 1 of the present disclosure, suspended substances P, such as debris N, in the chamber 2 may be prevented from building up, the suspended substances P may be taken in the port 80 and then ejected from the chamber 2 through the ejection path 81.

[2. Terms]

A "target" is a target to be irradiated with laser light introduced in the chamber. A target irradiated with laser light becomes plasma and emits EUV light.

"Suspended substances" are substances floating in the chamber. A floating substance may include at least one of debris generated by irradiation of a target with laser light, an etching gas supplied to the chamber, and a substance generated by reaction between debris and an etching gas.

"Debris" may include at least ions or atoms generated by irradiation of a target with laser light, or ions or fragments neutralized by collision with an etching gas.

A "reaction product" may include at least one of a product generated by reaction between ions and an etching gas, and a product (stannane gas) generated by reaction between target atoms, fragments, or the like and an etching gas.

[3. General Description of EUV Light Generation System]

[3.1 Configuration]

FIG. 1 schematically illustrates the configuration of an illustrative LPP EUV light generation system.

An EUV light generation device 1 may be used with at least one laser apparatus 3. In this application, a system including the EUV light generation device 1 and the laser apparatus 3 is referred to as an EUV light generation system 11. As illustrated in FIG. 1 and described later in detail, the EUV light generation device 1 may include a chamber 2 and a target supply unit 26. The chamber 2 may be a hermetically sealable. The target supply unit 26 may be mounted, for example, passing through the wall of the chamber 2. A material for the target 27 supplied from the target supply unit 26 may be tin, terbium, gadolinium, lithium, xenon, or any combination of two or more of them; however, this is not necessarily the case.

The wall of the chamber 2 may have at least one through hole. The through hole may be provided with a window 21 and pulse laser light 32 from the laser apparatus 3 may pass through the window 21. The chamber 2 may contain an EUV condenser mirror 23 having a spheroidal reflective surface. The EUV condenser mirror 23 may have first and second focuses. For example, a multi-layer reflective film with alternating molybdenum and silicon layers may be formed on the surface of the EUV condenser mirror 23. For example, the first focus of the EUV condenser mirror 23 is preferably located in a plasma generation region 25 and its second focus is preferably located at an intermediate light collection point (IF) 292. A through hole 24 may be provided in the center of the EUV condenser mirror 23 and pulse laser light 33 may pass through the through hole 24.

The EUV light generation device 1 may include an EUV light generation controller 5, a target sensor 4, and other components. The target sensor 4 may have an imaging function and be configured to detect the presence, path, position, speed, and other information on the target 27.

The EUV light generation device 1 may further include a connecting portion 29 that establishes communication between the interior of the chamber 2 and the interior of an exposure device 6. The connecting portion 29 may have a wall 291 with an aperture 293 in the interior. The wall 291 may be disposed so that its aperture 293 can be in the position of the second focus of the EUV condenser mirror 23.

The EUV light generation device 1 may further include a laser light travel direction controller 34, a laser light condenser mirror 22, a target collector 28 for recovery of the target 27, and other components. The laser light travel direction controller 34 may include an optical element for defining the travel direction of the laser light, and an actuator for adjusting the position, the posture and the like of the optical element.

[3.2 Operation]

As illustrated in FIG. 1, pulse laser light 31 from the laser apparatus 3 may pass through the laser light travel direction controller 34 and then enter the interior of the chamber 2 through the window 21 as the pulse laser light 32. The pulse laser light 32 may go into the chamber 2 along at least one laser light path and then be reflected off the laser light condenser mirror 22 to be directed onto at least one target 27 as pulse laser light 33.

The target supply unit 26 may be configured to direct the target 27 at the plasma generation region 25 in the chamber 2. The target 27 may be irradiated with at least one pulse of the pulse laser light 33. The target 27 irradiated with the pulse laser light becomes plasma from which EUV light 251 can be emitted in response to light having another wavelength. EUV light 251 may be selectively reflected off the EUV condenser mirror 23. The EUV light 252 reflected off the EUV condenser mirror 23 may be collected at the intermediate light collection point 292 and then fed to the exposure device 6. It should be noted that a single target 27 may be irradiated with more than one pulses of pulse laser light 33.

The EUV light generation controller 5 may be configured to control the entire EUV light generation system 11. The EUV light generation controller 5 may be configured to process image data or the like of the target 27 captured by the target sensor 4. Further, the EUV light generation controller 5 may be configured to control at least one of the timing and direction of the ejection of the target 27, for example. Moreover, the EUV light generation controller 5 may be configured to control at least one of the timing of lasing by the laser apparatus 3, the travel direction of the pulse laser light 32, and the position where the pulse laser light 33 is collected, for example. These different controls are illustrative only and other controls may be optionally added.

[4. EUV Light Generation Device Including Magnetic Field Forming Device and Ion Catcher]

[4.1 Configuration]

The configuration of an EUV light generation device 1 including a magnetic field forming device and ion catchers will be described with reference to FIG. 2.

Figure 2:
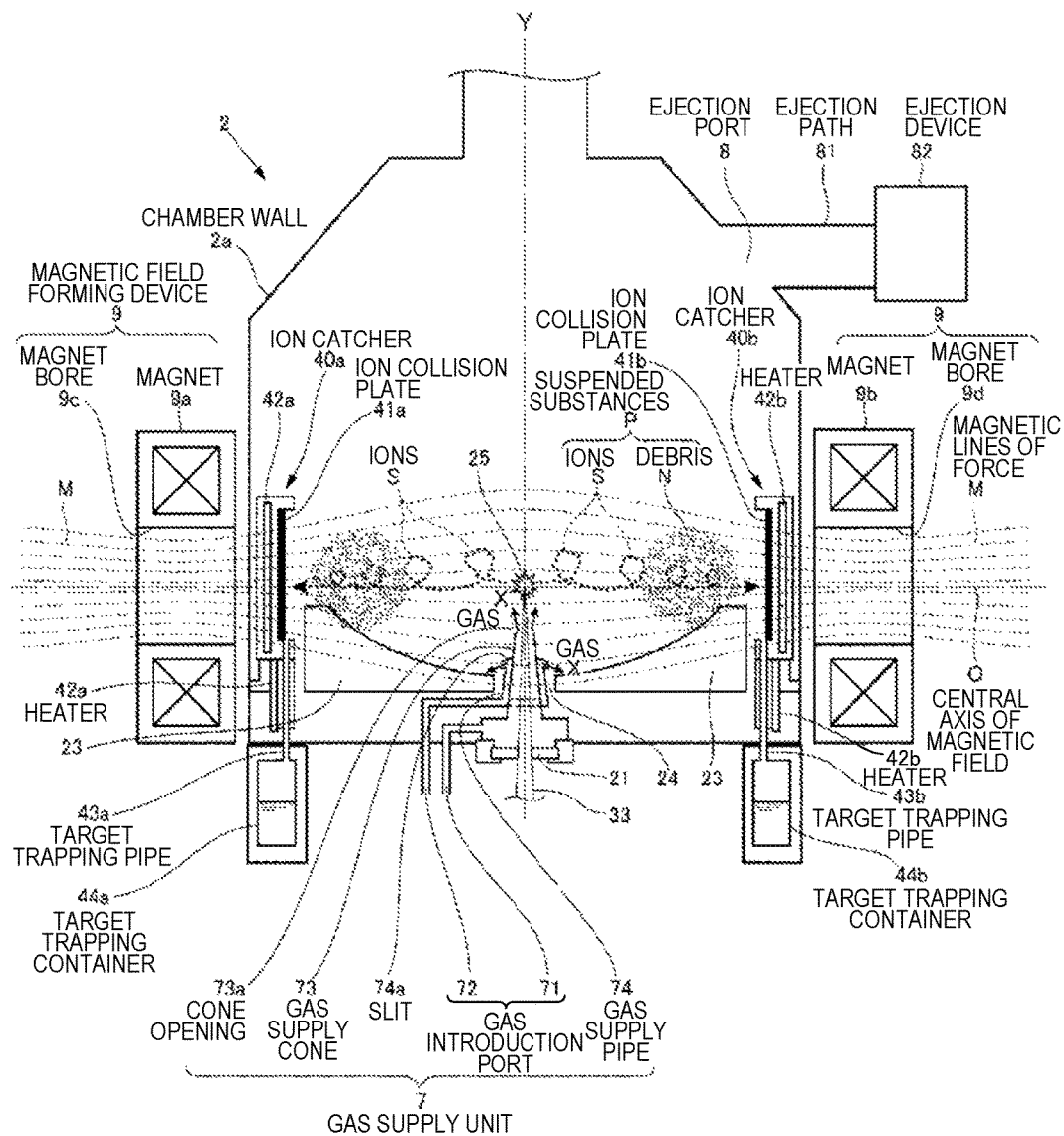
FIG. 2 illustrates a configuration of an EUV light generation device including a magnetic field forming device and an ion catcher.

FIG. 2 illustrates the cross-sectional configuration of the chamber 2 in the EUV light generation device 1 in FIG. 1 and may be a drawing illustrating the interior of the chamber 2.

The chamber 2 in the EUV light generation device 1 may be, for example, a hollow ball or cylinder. The chamber central axis Y of the cylindrical chamber 2 may extend in the direction in which EUV light 252 is guided to the exposure device 6.

A magnetic field forming device 9 including magnets 9a and 9b may be disposed outside of the chamber 2.

The magnets 9a and 9b may be two coiled electromagnets. The magnets 9a and 9b may be positioned opposite to each other across the plasma generation region 25 in the chamber 2 so that a mirror magnetic field having a central axis O as the central axis of the magnetic field can be generated. The magnets 9a and 9b may be, for example, superconducting coiled electromagnets.

The magnets 9a and 9b may be two coiled electromagnets having magnet bores 9c and 9d as spaces therebetween.

The magnets 9a and 9b may form a magnetic field in the chamber 2.

To be specific, the magnets 9a and 9b may form a mirror magnetic field surrounding the plasma generation region 25.

The chamber 2 may include ion catchers 40a and 40b, a gas supply unit 7, and an ejection port 8.

The ion catchers 40a and 40b may be positioned opposite to each other across the plasma generation region 25 in the vicinity of the inner wall of the chamber 2. The ion catchers 40a and 40b may be positioned near a position where magnetic lines of force M of the magnetic field formed by the magnets 9a and 9b converge.

The ion catcher 40a may include an ion collision plate 41a, a heater 42a, a target trapping pipe 43a, and a target trapping container 44a.

The ion catcher 40b may include an ion collision plate 41b, a heater 42b, a target trapping pipe 43b, and a target trapping container 44b.

The heaters 42a and 42b may directly or indirectly heat the ion collision plates 41a and 41b and the target trapping pipes 43a and 43b to a temperature at or above the melting point of the target 27 such as tin.

The target trapping containers 44a and 44b may be detachable from the chamber 2.

The gas supply unit 7 may include gas introduction ports 71 and 72, a gas supply cone 73, a gas supply pipe 74, a cone opening 73a, and a slit 74a.

It should be noted that the gas supply unit 7 including the gas introduction ports 71 and 72, the gas supply cone 73, the gas supply pipe 74, the cone opening 73a, and the slit 74a is also referred to as "first etching gas supply unit".

One end of the gas introduction port 71 may be connected to an etching gas source not illustrated. The other end of the gas introduction port 71 may be in communication with the interior of the gas supply cone 73. One end of the gas introduction port 72 may be connected to the etching gas source not illustrated. The other end of the gas introduction port 72 may be in communication with the gas supply pipe 74.

The gas supply cone 73 may include a holder structure holding the window 21 so as to surround it as illustrated in FIG. 2. The gas supply cone 73 may include the cone opening 73a extending from the through hole 24 of the EUV condenser mirror 23.

The cone opening 73a may open toward the plasma generation region 25.

The gas supply pipe 74 may be a pipe structure provided to the perimeter of the gas supply cone 73 and having the slit 74a.

The slit 74a may open toward the reflective surface of the EUV condenser mirror 23. The slit 74a may open toward the entire perimeter of the reflective surface of the EUV condenser mirror 23. The slit 74a may be a generally rectangular opening. Alternatively, the slit 74a may be a plurality of circular openings or an opening having another shape, which may provide similar effects.

The etching gas X blown from the cone opening 73a and the slit 74a into the chamber 2 may contain a gas that reacts with the target 27 and generates a reaction gaseous product at room temperature. When the target 27 is tin, the etching gas X may be $H_2$ or a gas containing $H_2$. Alternatively, the etching gas X may include an H radical instead of or in addition to an $H_2$ gas.

The H radical may be produced by addition of a hydrogen radical generator (HRG) in the piping path from the etching gas source to the gas introduction ports 71 and 72.

The HRG may be formed by a heated filament or the like in the piping path of the gas introduction ports 71 and 72 and configured to radicalize the passing etching gas X.

The ejection port 8 may be provided in the inner wall of the chamber 2. The ejection port 8 may be connected to an ejection device 82 through the ejection path 81.

The ejection device 82 may eject the gas in the chamber 2 by suction. The ejection device 82 may suck the gas in the chamber 2 and eject suspended substances P contained in the gas to the outside of the chamber 2.

The ejection path 81 may pass the gas in the chamber 2 by suction of the ejection device 82 to the ejection device 82 and eject suspended substances P contained in the gas to the ejection device 82.

[4.2 Operation]

Embodiments in which tin is used as the target 27 will now be described.

Ions S emitted from the plasma in the chamber 2 may fly from the plasma generation region 25 across the chamber 2.

The ions S move in a spiral according to Lorentz force along the magnetic lines of force M of the magnetic field formed by the magnets 9a and 9b while colliding with the ion collision plates 41a and 41b of the ion catchers 40a and 40b. The ions S colliding with the ion collision plates 41a and 41b may deactivate on the surfaces of the ion collision plates 41a and 41b. The ions S deactivating on the surfaces of the ion collision plates 41a and 41b may be trapped on the surfaces of the ion collision plates 41a and 41b.

The ions S trapped by the ion collision plates 41a and 41b may become molten tin on the ion collision plates 41a and 41b. The molten tin may pass through the target trapping pipes 43a and 43b and be trapped by the target trapping containers 44a and 44b.

After being trapped by the target trapping containers 44a and 44b, the molten tin may solidify.

The target trapping containers 44a and 44b may be exchanged during maintenance or the like.

The debris flying from the plasma generation region 25 may be prevented from adhering to the window 21 depending on the momentum of the etching gas X supplied from the cone opening 73a.

The debris adhering to the window 21 may react with the etching gas X in the gas supply cone 73, generating a reaction gaseous product at room temperature.

For example, when the target 27 is tin, the reaction product may be $SnH_4$ (stannane). $SnH_4$ may be gaseous at room temperature.

It should be noted that gaseous SnH₄ (stannane) is also referred to as "stannane gas".

The etching gas X may pass through the gas supply pipe 74 through the gas introduction port 72 and be supplied to the reflective surface of the EUV condenser mirror 23 through the slit 74a.

The etching gas X supplied from the slit 74a may react with the debris on the reflective surface of the EUV condenser mirror 23, generating a reaction gaseous product at room temperature.

The etching gas X not reacting with the debris and the product generated by reaction between the etching gas X and the debris may be ejected to the outside of the chamber 2 through the ejection port 8 by the ejection device 82.

The ejection device 82 may eject the gas in the chamber 2 at the substantially same flow rate as that for the etching gas X supplied by the gas supply unit 7, keeping the internal pressure of the chamber 2 at a substantially constant level.

[4.3 Effect]

Ions S generated in the plasma generation region 25 by generation of EUV light may be guided to the ion catchers 40a and 40b by the effects of the magnetic lines of force M of the magnetic field formed by the magnets 9a and 9b, and then trapped on the surfaces of the ion collision plates 41a and 41b.

Consequently, the ions S flying in the chamber 2 may be prevented from travelling toward the EUV condenser mirror 23. Thus, sputtering on the reflective surface of the EUV condenser mirror 23 due to the collision of the ions S may be reduced.

Even when the debris adheres to the reflective surface of the EUV condenser mirror 23, that debris may react with the etching gas X and then be ejected to the outside of the chamber 2 in the form of a gaseous reaction product (stannane gas).

[5. Problem to be Solved]

Tin on the surfaces of the ion collision plates 41a and 41b may be sputtered by collision of newly arrived ions S, and the flying tin atoms may adhere to the reflective surface of the EUV condenser mirror 23.

Ions S generated in the plasma generation region 25 may collide with the etching gas X supplied to the chamber 2, loose speed, and then build up in a portion where they converge. The ions S are also neutralized by recombination with electrons or collision with other particles and then start to be gradually diffused in the chamber 2. The diffused ions S may adhere to the reflective surface of the EUV condenser mirror 23.

Accordingly, flying tin atoms or debris N containing neutralized ions S adhere to the EUV condenser mirror 23, resulting in reductions in reflectance and emission of EUV light. If the emission of EUV light decreases below a predetermined level, the EUV condenser mirror 23, which is expensive, should be exchanged, increasing the cost.

[6. Ports and Ejection Paths Included in EUV Light Generation Device According to First Embodiment]

[6.1 Configuration]

The configurations of ports 80 and the ejection paths 81 included in an EUV light generation device 1 according to the first embodiment will be described referring to FIGS. 3A and 3B.

Figure 3A:
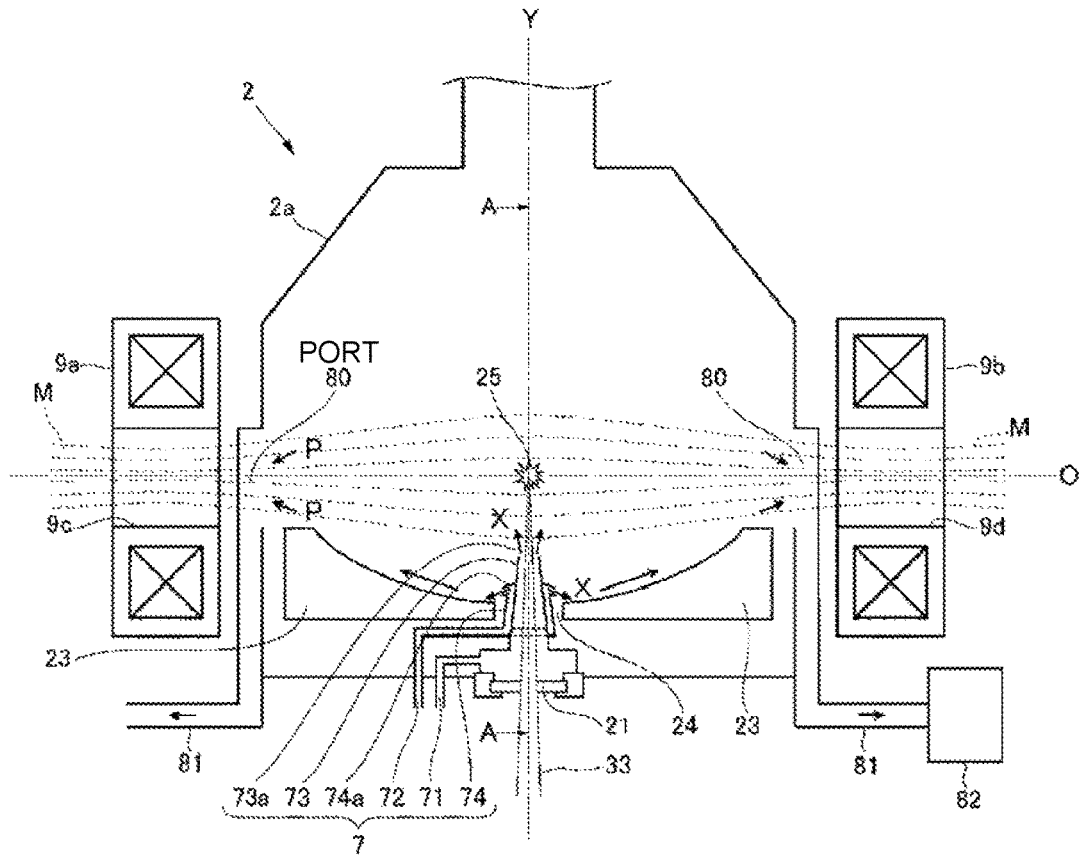
FIG. 3A is a diagram for explaining a configuration of an EUV light generation device according to a first embodiment.

Here, FIG. 3A is a diagram for explaining the configuration of the EUV light generation device 1 according to the first embodiment.

Figure 3B:
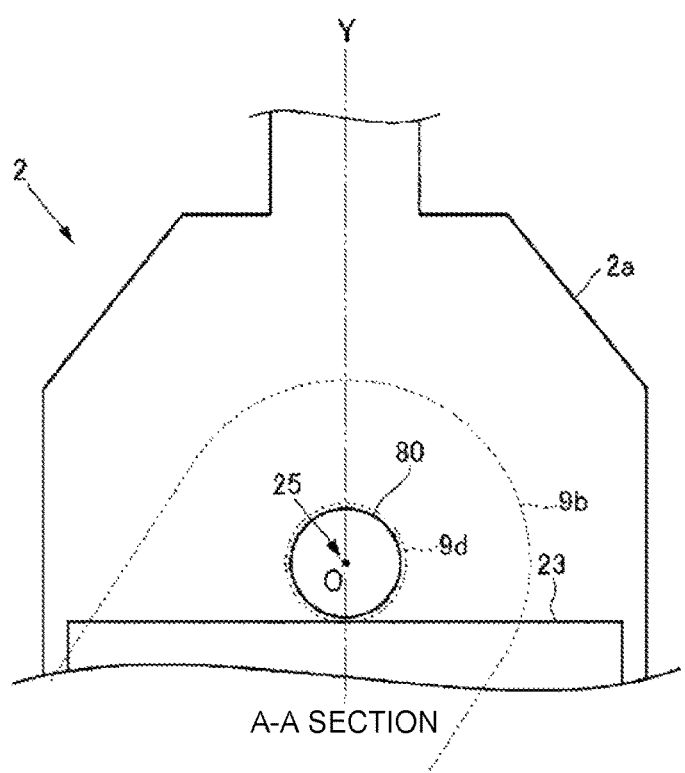
FIG. 3B is a cross-sectional view along a line A-A of a chamber illustrated in FIG. 3A.

FIG. 3B is a cross-sectional view along a line A-A of the chamber illustrated in FIG. 3A.

It should be noted that the gas supply unit 7 is omitted in FIG. 3B.

The EUV light generation device 1 according to the first embodiment may differ from the EUV light generation device 1 illustrated in FIG. 2 in that the ports 80 may be provided in the inner wall of the chamber wall 2a in the forms of openings.

In the EUV light generation device 1 according to the first embodiment, the ejection paths 81 may extend from the outer surface of the chamber wall 2a.

The configurations of the gas supply unit 7, the ejection device 82, and the magnetic field forming device 9 according to the first embodiment may be similar to those in the EUV light generation device 1 illustrated in FIG. 2.

The description of the components of the EUV light generation device 1 according to the first embodiment which are similar to those in the EUV light generation device 1 illustrated in FIG. 2 will be omitted.

The ports 80 in FIG. 3A may be provided in the interior of the chamber 2 and between the plasma generation region 25 and the magnets 9a and 9b.

The ports 80 may be disposed in two positions: between the magnet 9a and the plasma generation region 25 and between the magnet 9b and the plasma generation region 25.

The center of the opening of each port 80 may be substantially on the central axis O.

The shape of the port 80 may be circular as illustrated in FIGS. 3A and 3B, and may be rectangular or in any other shape.

As illustrated in FIG. 3B, the ports 80 may be provided on the inner wall of the chamber wall 2a in the forms of openings. The positions of the ports 80 may substantially match the positions of the magnet bore 9c of the magnet 9a and the magnet bore 9d of the magnet 9b outside of the chamber 2 viewed from the direction of the central axis O of the magnetic field.

As illustrated in FIG. 3A, the ejection paths 81 may extend from the outer surface of the chamber wall 2a and be connected to the ports 80. The ejection paths 81 may be connected to the corresponding port 80 and the ejection device 82.

The ejection paths 81 formed on and extending from the outer surface of the chamber wall 2a may be disposed between the chamber 2 and the magnets 9a and 9b.

The ejection paths 81 and the ejection device 82 may include a suspended substance trap not illustrated. In addition, a suspended substance P removing device not illustrated may be provided downstream of the ejection device 82.

As for the operation conditions for the magnets 9a and 9b in the EUV light generation device 1, the magnetic flux density of the magnetic field in the chamber 2 may be in the range of 0.4 T to 3.0 T, preferably 0.5 T to 1.5 T.

The total flow rate of the etching gas X introduced to the chamber 2 may be in the range of 5 slm (standard liter/min) to 200 slm, preferably 10 slm to 30 slm.

It should be noted that the gas introduction ports 71 and 72 may be connected to gas lock mechanisms not illustrated for protecting various sensors and windows for monitor in the chamber 2 and may be used to introduce the etching gas X to the gas lock mechanisms.

The flow rate of the etching gas X from the gas introduction ports 71 and 72 may be determined considering the flow rate of the etching gas X introduced to the gas lock mechanisms not illustrated.

The gas pressure in the chamber 2 may be in the range of 5 Pa to 200 Pa, preferably 10 Pa to 40 Pa.

A temperature adjusting device not illustrated may be provided to keep the temperature of the EUV condenser mirror 23 at or below 60° C. The temperature of the EUV condenser mirror 23 may preferably be adjusted to be at or below 20° C.

It should be noted that the other components of the EUV light generation device 1 according to the first embodiment may be similar to those of the EUV light generation device 1 illustrated in FIG. 2.

[6.2 Operation]

The ions S generated in the plasma generation region 25 may be partly affected by the magnetic lines of force M formed by the magnetic field forming device 9 and move toward a portion where the magnetic lines of force M converge.

The ions S near the portion where the magnetic lines of force M converge may collide with and adhere to the chamber wall 2a. Ions S may also cause sputtering of tin on the chamber wall 2a. Low-speed ions S, which are almost unaffected by the magnetic field formed by the magnetic field forming device 9, may collide with the etching gas X, lose speed, and then build up near the portion where the magnetic lines of force M converge. The building up ions S may be neutralized by recombination with electrons or collision with other particles.

Further, the etching gas X supplied from the slit 74a of the gas supply pipe 74 may react with debris N on the reflective surface of the EUV condenser mirror 23, generating a reaction gaseous product.

The generated reaction product may flow, along the flow of the etching gas X, toward a portion in the vicinity of the edge of the EUV condenser mirror 23 where the magnetic lines of force M converge.

It should be noted that the etching gas X which does not react with the debris N may also flow, along the surface of the EUV condenser mirror 23, toward a portion where the magnetic lines of force M converge.

The debris N may move along the flow of the etching gas X and be ejected to the outside of the chamber 2 through the ports 80. The debris N taken into the ports 80 may be ejected by the ejection device 82 to the outside of the chamber 2 through the ejection path 81.

Similarly, the reaction product and the etching gas X may be taken into the port 80 and then ejected by the ejection device 82 to the outside of the chamber 2 through the ejection path 81.

[6.3 Effect]

In the first embodiment, debris N may be ejected to the outside of the chamber 2 through the port 80 without building up in the chamber 2.

Consequently, debris N may diffuse in the chamber 2 and be prevented from adhering to the reflective surface of the EUV condenser mirror 23. Further, sputtering on the reflective surface of the EUV condenser mirror 23 due to ions S may be suppressed.

Accordingly, a reduction in the reflectance of the EUV condenser mirror 23 may be suppressed. Thus, the lifetime of the EUV condenser mirror 23 may be extended and the frequency of exchanging the EUV condenser mirror 23 may be reduced. As a result, the running cost for the EUV light generation device 1 may be reduced.

[7. Ports and Ejection Path Included in EUV Light Generation Device According to Modification 1 of First Embodiment]

[7.1 Configuration]

The configurations of the ports 80 and the ejection path 81 included in an EUV light generation device 1 according to Modification 1 of the first embodiment will be described referring to FIGS. 4A to 4D.

Figure 4A:
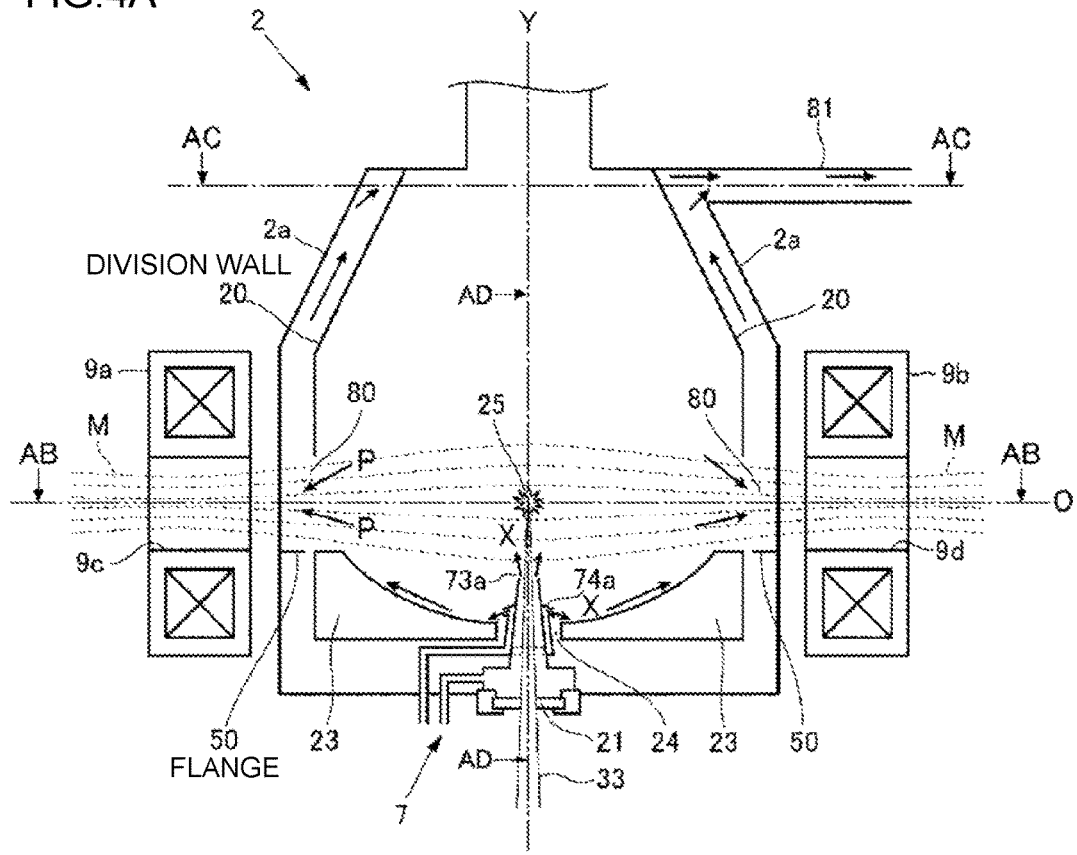
FIG. 4A is a diagram for explaining a configuration of an EUV light generation device according to Modification 1 of the first embodiment.

Here, FIG. 4A is a diagram for explaining the configuration of the EUV light generation device 1 according to Modification 1 of the first embodiment.

Figure 4B:
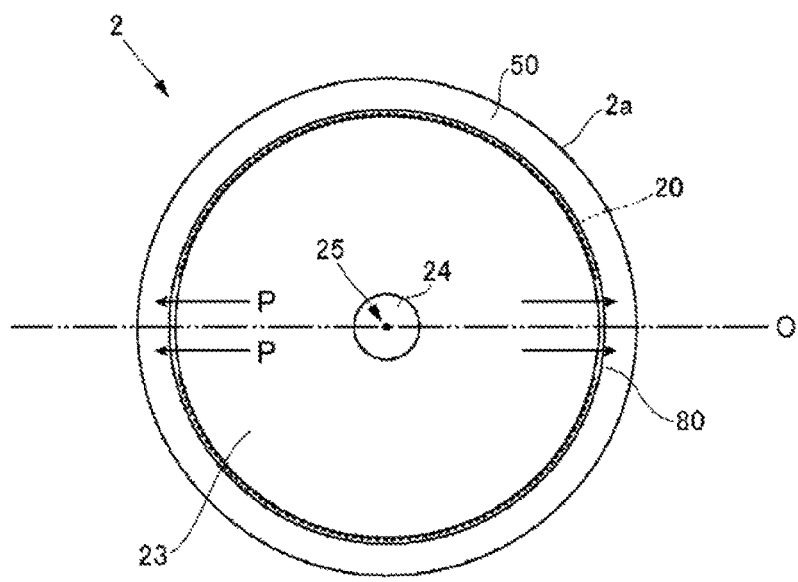
FIG. 4B is a cross-sectional view along a line AB-AB of a chamber illustrated in FIG. 4A.

FIG. 4B is a cross-sectional view along a line AB-AB of the chamber illustrated in FIG. 4A.

Figure 4C:
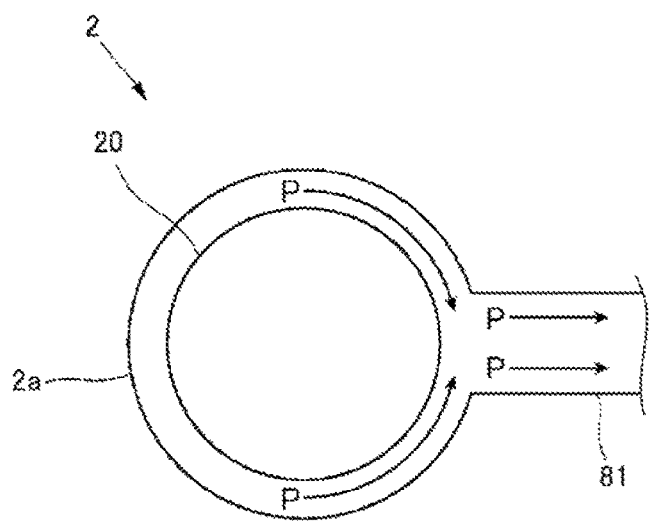
FIG. 4C is a cross-sectional view along a line AC-AC of the chamber illustrated in FIG. 4A.

FIG. 4C is a cross-sectional view along a line AC-AC of the chamber illustrated in FIG. 4A.

Figure 4D:
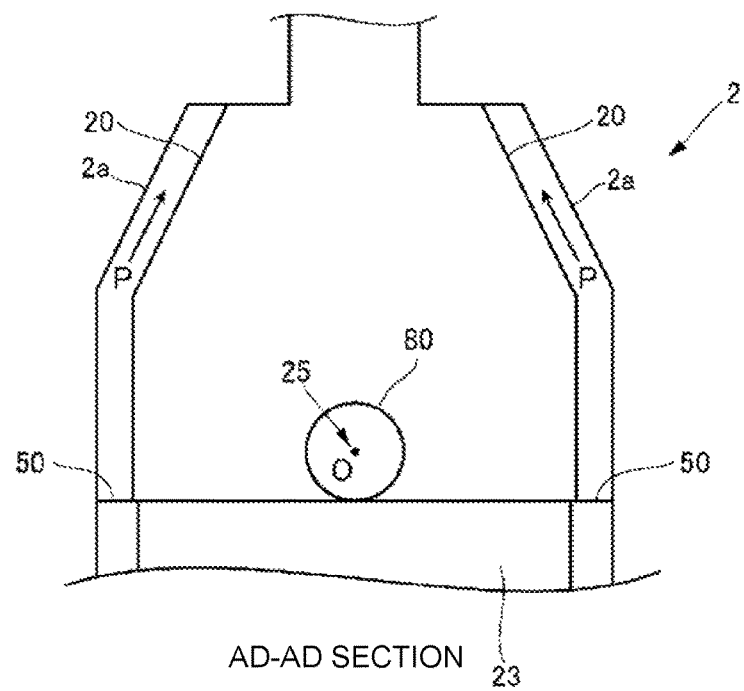
FIG. 4D is a cross-sectional view along a line AD-AD of the chamber illustrated in FIG. 4A.

FIG. 4D is a cross-sectional view along a line AD-AD of the chamber illustrated in FIG. 4A.

It should be noted that the gas supply unit 7 is omitted in FIGS. 4B to 4D.

The EUV light generation device 1 according to Modification 1 of the first embodiment may differ from the EUV light generation device 1 illustrated in FIG. 2 and the EUV light generation device 1 according to the first embodiment in that part of the ejection path 81 may be provided as a predetermined space defined by the division wall 20 and the chamber wall 2a.

The configurations of the gas supply unit 7, the ejection device 82, and the magnetic field forming device 9 according to Modification 1 of the first embodiment may be similar to those in the EUV light generation device 1 illustrated in FIG. 2 and the EUV light generation device 1 according to the first embodiment.

The description of the components of the EUV light generation device 1 according to Modification 1 of the first embodiment which are similar to those in the EUV light generation device 1 illustrated in FIG. 2 and the EUV light generation device 1 according to the first embodiment illustrated in FIG. 3A will be omitted.

As illustrated in FIG. 4A, the chamber 2 may include a division wall 20 inside of the chamber wall 2a. The chamber 2 may include a flange 50 inside of the chamber 2 and around the EUV condenser mirror 23. In the chamber 2, the chamber wall 2a, the division wall 20, and the flange 50 define the predetermined space.

As illustrated in FIG. 4A, the ejection path 81 may include the predetermined space defined by the chamber wall 2a, the division wall 20, and the flange 50 and be connected to the ports 80. The ejection path 81 may be connected to the ports 80 and the ejection device 82.

It should be noted that the division wall 20 may serve as a heat shield.

The division wall 20 serving as a heat shield may be a heat shield mechanism provided between the plasma generation region 25 and the chamber wall 2a to prevent heat generated in the plasma generation region 25 from heating the chamber wall 2a and expanding the chamber 2. The division wall 20 serving as a heat shield may include a cooling mechanism not illustrated.

As illustrated in FIG. 4D, each port 80 may be provided on an inner surface of the division wall 20 in the form of an opening.

As illustrated in FIG. 4B, suspended substances P generated in the chamber 2 may be taken into the ports 80 on the division wall 20. The suspended substances P taken into the ports 80 may flow through a path which is part of the ejection path 81 and defined by the chamber wall 2a, the division wall 20, and the flange 50. Subsequently, as illustrated in FIG. 4C, the suspended substances P may flow toward the ejection device 82 not illustrated through the ejection path 81.

The configurations of the other components of the EUV light generation device 1 according to Modification 1 of the first embodiment may be similar to those in the EUV light generation device 1 illustrated in FIG. 2 and the EUV light generation device 1 according to the first embodiment illustrated in FIG. 3A.

[7.2 Effect]

In Modification 1 of the first embodiment, the chamber 2 includes the division wall 20 and the flange 50 in the interior, which makes effective use of the internal space where part of the ejection path 81 may be provided.

Accordingly, the cross-sectional area of the path for ejecting the gas containing suspended substances P in the chamber 2 can be increased. Hence, the gas in the chamber 2 can be efficiently ejected.

The EUV light generation device 1 can therefore eject the gas in the chamber 2 at a higher flow rate with the same performance of the ejection device 82. In addition, the pressure in the chamber 2 can be maintained at a predetermined pressure even at a higher flow rate of the etching gas X supplied to the chamber 2.

Consequently, the EUV light generation device 1 may achieve a high flow rate of the etching gas X, so that the gas containing suspended substances P in the chamber 2 may be efficiently ejected.

[8. Ports and Ejection Paths Included in EUV Light Generation Device According to Modification 2 of First Embodiment]

[8.1 Configuration]

The configurations of the ports 80 and the ejection paths 81 included in an EUV light generation device 1 according to Modification 2 of the first embodiment will be described referring to FIGS. 5A to 5C.

Figure 5A:
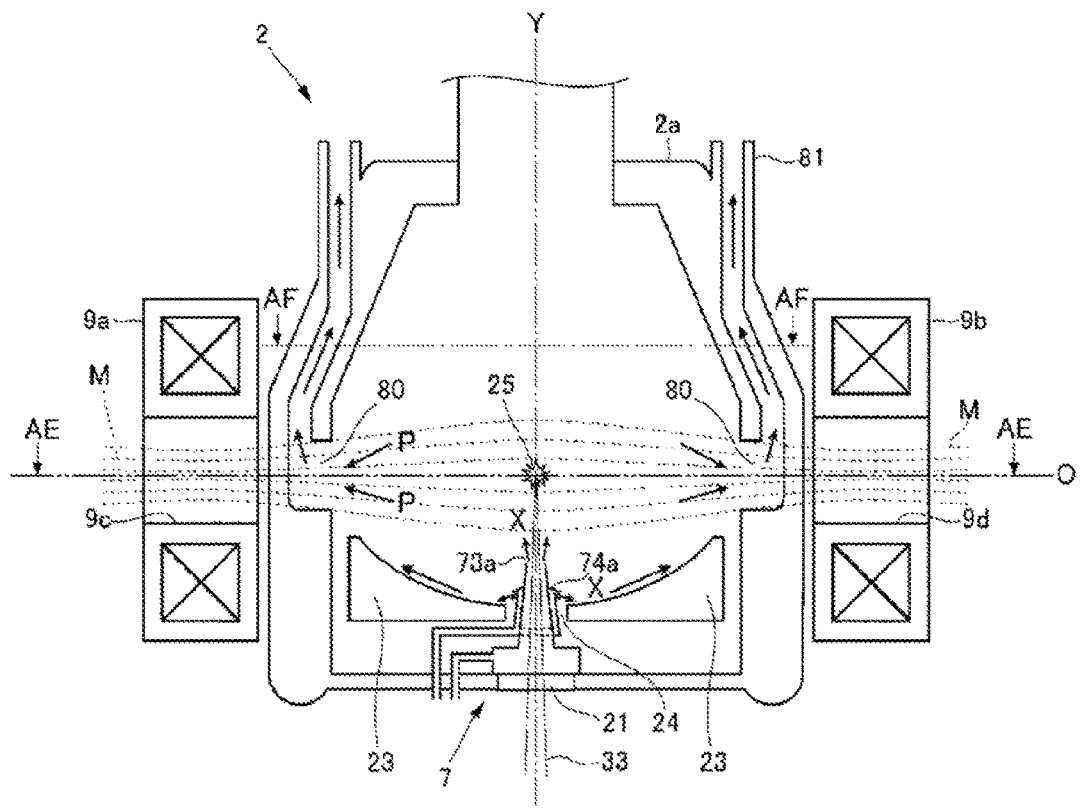
FIG. 5A is a diagram for explaining a configuration of an EUV light generation device according to Modification 2 of the first embodiment.

Here, FIG. 5A is a diagram for explaining the configuration of the EUV light generation device 1 according to Modification 2 of the first embodiment.

Figure 5B:
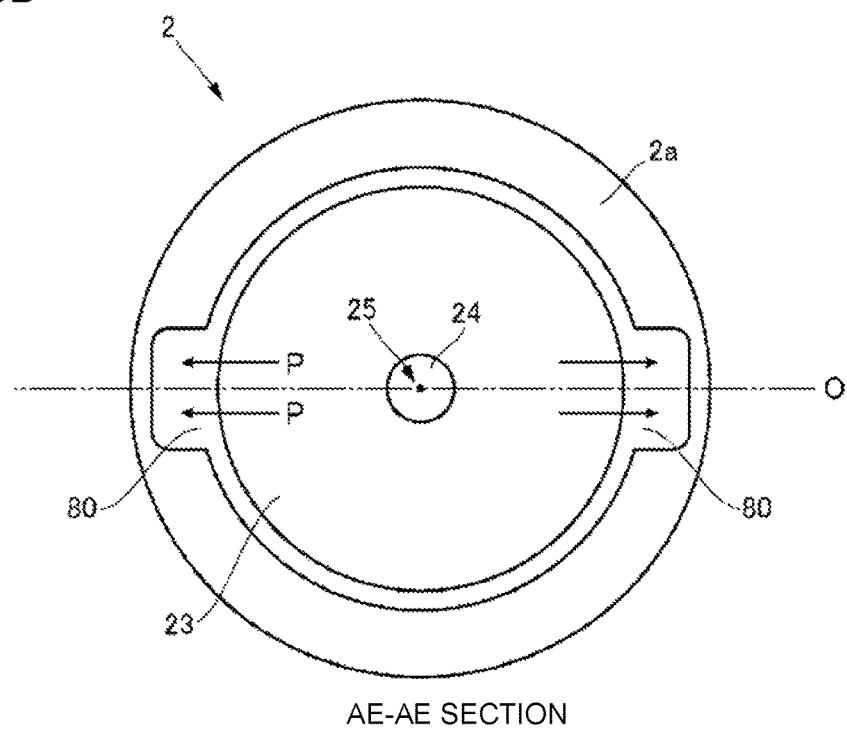
FIG. 5B is a cross-sectional view along a line AE-AE of a chamber illustrated in FIG. 5A.

FIG. 5B is a cross-sectional view along a line AE-AE of the chamber illustrated in FIG. 5A.

Figure 5C:
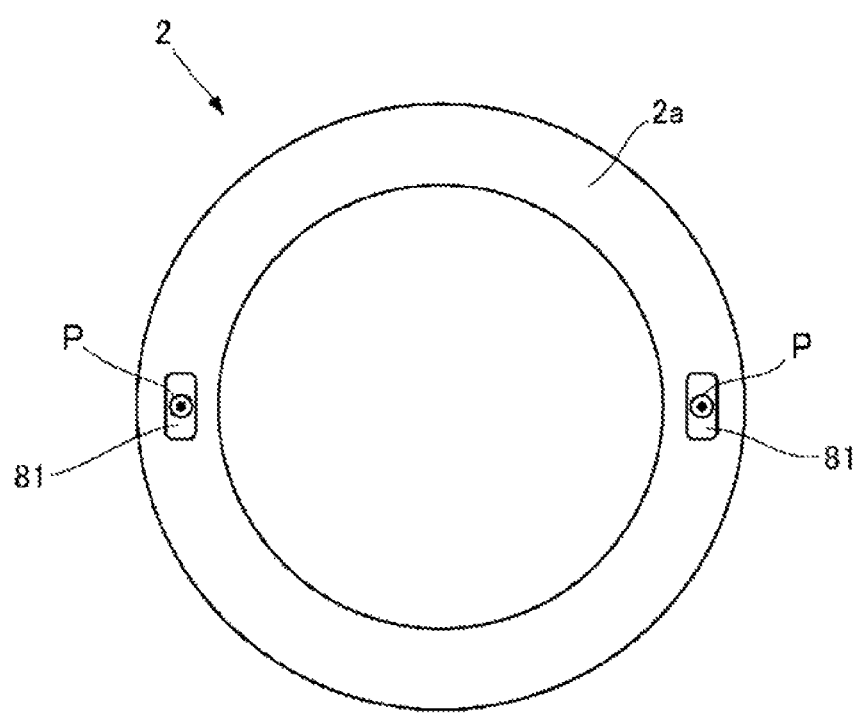
FIG. 5C is a cross-sectional view along a line AF-AF of the chamber illustrated in FIG. 5A.

FIG. 5C is a cross-sectional view along a line AF-AF of the chamber illustrated in FIG. 5A.

It should be noted that the gas supply unit 7 is omitted in FIGS. 5B and 5C.

The EUV light generation device 1 according to Modification 2 of the first embodiment may differ from the EUV light generation device 1 illustrated in FIG. 2 and the EUV light generation device 1 according to the first embodiment illustrated in FIG. 3A in that part of the ejection paths 81 may be provided in the chamber wall 2a.

The configurations of the gas supply unit 7, the ejection device 82, and the magnetic field forming device 9 according to Modification 2 of the first embodiment may be similar to those in the EUV light generation device 1 illustrated in FIG. 2 and the EUV light generation device 1 according to the first embodiment illustrated in FIG. 3A.

The description of the components of the EUV light generation device 1 according to Modification 2 of the first embodiment which are similar to those in the EUV light generation device 1 illustrated in FIG. 2 and the EUV light generation device 1 according to the first embodiment illustrated in FIG. 3A will be omitted.

The ports 80 may be provided on the chamber wall 2a.

As illustrated in FIG. 5A, the ejection paths 81 may include paths formed in the chamber wall 2a. The ejection paths 81 may carry suspended substances P, which are taken from the ports 80 through the paths formed in the chamber wall 2a, to an ejection device 82 not illustrated.

As illustrated in FIG. 5B, suspended substances P generated in the chamber 2 may be taken into the ports 80 on the chamber wall 2a. As illustrated in FIG. 5A, the suspended substances P taken into the ports 80 may flow through the paths formed in the chamber wall 2a. Subsequently, as illustrated in FIG. 5C, the suspended substances P may flow toward the ejection device 82 not illustrated through the ejection paths 81.

The configurations of the other components of the EUV light generation device 1 according to Modification 2 of the first embodiment may be similar to those in the EUV light generation device 1 illustrated in FIG. 2 and the EUV light generation device 1 according to the first embodiment illustrated in FIG. 3A.

[8.2 Effect]

In Modification 2 of the first embodiment, the chamber 2 includes part of the ejection paths 81 in the chamber wall 2a, which makes effective use of the space occupied by the chamber 2 for the formation of paths for ejecting suspended substances P. This can make the chamber 2 compact.

[9. Ports and Ejection Paths Included in EUV Light Generation Device According to Modification 3 of First Embodiment]

[9.1 Configuration]

The configurations of the ports 80 and the ejection paths 81 included in an EUV light generation device 1 according to Modification 3 of the first embodiment will be described referring to FIG. 6.

Figure 6:
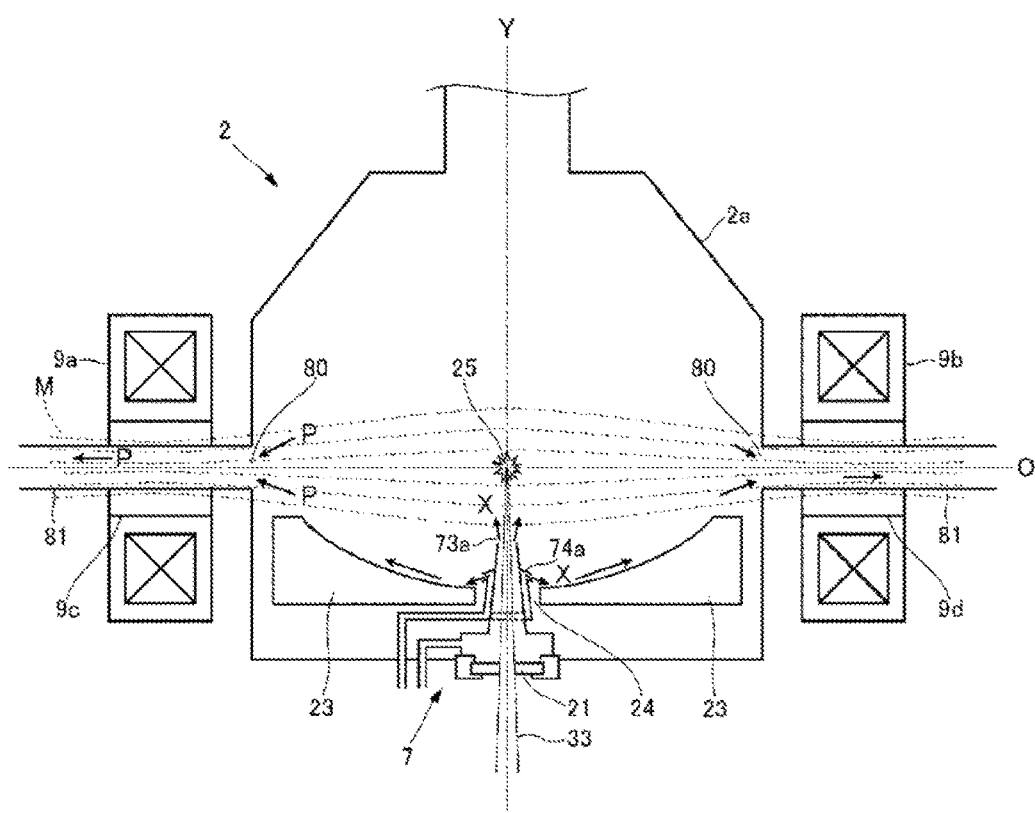
FIG. 6 is a diagram for explaining a configuration of the EUV light generation device according to Modification 3 of the first embodiment.

Here, FIG. 6 is a diagram for explaining the configuration of the EUV light generation device 1 according to Modification 3 of the first embodiment.

The EUV light generation device 1 according to Modification 3 of the first embodiment may differ from the EUV light generation device 1 illustrated in FIG. 2 and the EUV light generation device 1 according to the first embodiment illustrated in FIG. 3A in that part of the ejection paths 81 may be provided passing through the magnet bores 9c and 9d of the magnets 9a and 9b.

The configurations of the gas supply unit 7, the ejection device 82, and the magnetic field forming device 9 according to Modification 3 of the first embodiment may be similar to those in the EUV light generation device 1 illustrated in FIG. 2 and the EUV light generation device 1 according to the first embodiment illustrated in FIG. 3A.

The description of the components of the EUV light generation device 1 according to Modification 3 of the first embodiment which are similar to those in the EUV light generation device 1 illustrated in FIG. 2 and the EUV light generation device 1 according to the first embodiment illustrated in FIG. 3A will be omitted.

As illustrated in FIG. 6, the ports 80 may be provided on the chamber wall 2a in the forms of openings.

The ejection paths 81 may include paths passing through the magnet bores 9c and 9d of the magnets 9a and 9b. The ejection paths 81 may carry suspended substances P, which are taken from the ports 80 through the paths passing through the magnet bores 9c and 9d, to an ejection device 82 not illustrated.

The ejection paths 81 including the paths in the magnet bores 9c and 9d may extend along the central axis O.

The configurations of the other components of the EUV light generation device 1 according to Modification 3 of the first embodiment may be similar to those in the EUV light generation device 1 illustrated in FIG. 2 and the EUV light generation device 1 according to the first embodiment illustrated in FIG. 3A.

[9.2 Effect]

Modification 3 of the first embodiment can prevent ions S from colliding with the chamber wall 2a, thereby suppressing the generation of tin atoms due to sputtering. This EUV light generation device 1 may include paths in the magnet bores 9c and 9d as part of the ejection paths 81, and Modification 3 can achieve a simple configuration for ejecting suspended substances P generated in the chamber 2.

The EUV light generation device 1 may make effective use of spaces in the magnet bores 9c and 9d and have less bending portions of the ejection paths 81. This may increase the flow rate of the gas flowing through the ejection paths 81. Accordingly, the EUV light generation device 1 can efficiently eject the gas containing suspended substances P in the chamber 2.

[10. Ports and Ejection Paths Included in EUV Light Generation Device According to Modification 4 of First Embodiment]

[10.1 Configuration]

The configurations of the ports 80 and the ejection paths 81 included in an EUV light generation device 1 according to Modification 4 of the first embodiment will be described referring to FIG. 7.

Figure 7:
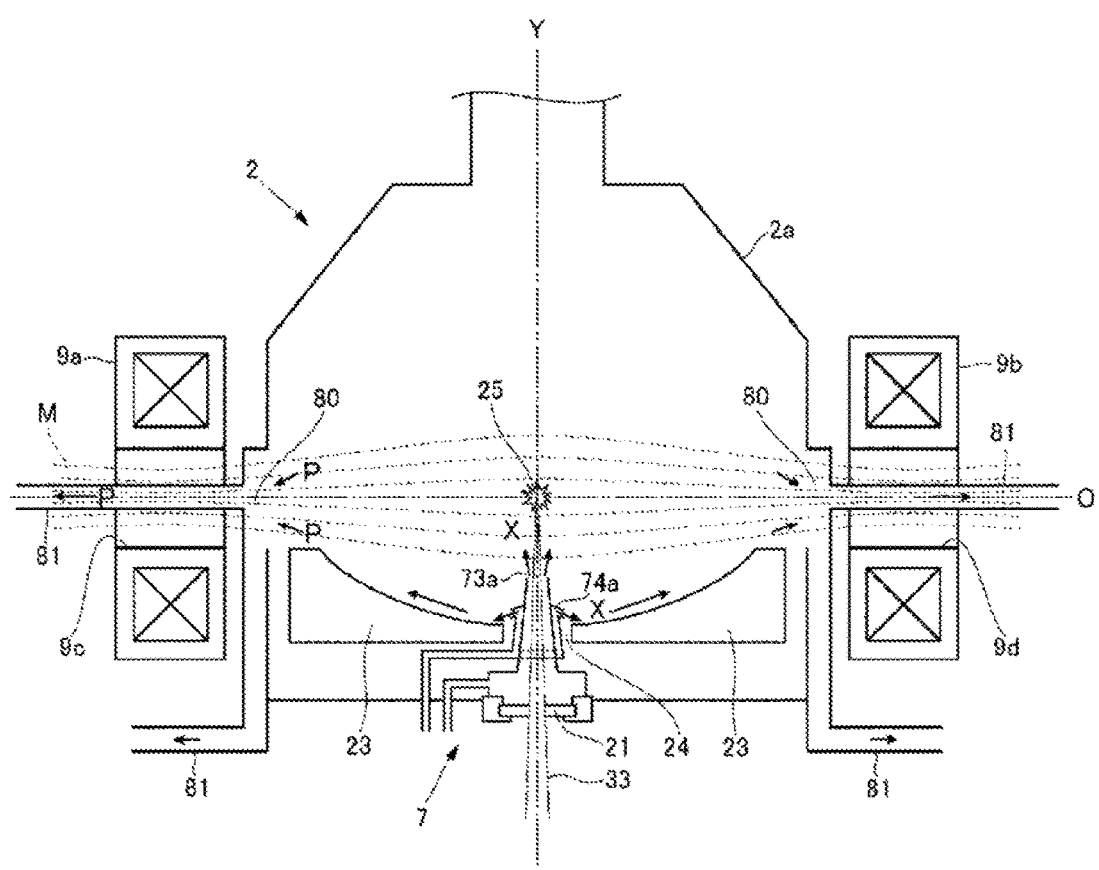
FIG. 7 is a diagram for explaining a configuration of an EUV light generation device according to Modification 4 of the first embodiment.

Here, FIG. 7 is a diagram for explaining the configuration of the EUV light generation device 1 according to Modification 4 of the first embodiment.

The EUV light generation device 1 according to Modification 4 of the first embodiment may differ from the EUV light generation device 1 illustrated in FIG. 2 and the EUV light generation device 1 according to the first embodiment illustrated in FIG. 3A in that part of each ejection path 81 may be provided passing through the magnet bores 9c and 9d and the other part of the ejection path 81 may extend from the outer surface of the chamber wall 2a.

The configurations of the gas supply unit 7, the ejection device 82, and the magnetic field forming device 9 according to Modification 4 of the first embodiment may be similar to those in the EUV light generation device 1 illustrated in FIG. 2 and the EUV light generation device 1 according to the first embodiment illustrated in FIG. 3A.

The description of the components of the EUV light generation device 1 according to Modification 4 of the first embodiment which are similar to those in the EUV light generation device 1 illustrated in FIG. 2 and the EUV light generation device 1 according to the first embodiment illustrated in FIG. 3A will be omitted.

The ports 80 may be connected to the ejection paths 81 including paths extending from the outer surface of the chamber 2 and paths passing through the magnet bores 9c and 9d of the magnets 9a and 9b.

The ejection paths 81 may be connected to the ports 80 through the paths extending from the outer surface of the chamber 2 and the paths passing through the magnet bores 9c and 9d.

The ejection paths 81 may carry suspended substances P, which are taken from the ports 80 through the paths extending from the outer surface of the chamber 2 and the paths passing through the magnet bores 9c and 9d, to an ejection device 82 not illustrated.

The configurations of the other components of the EUV light generation device 1 according to Modification 4 of the first embodiment may be similar to those in the EUV light generation device 1 illustrated in FIG. 2 and the EUV light generation device 1 according to the first embodiment illustrated in FIG. 3A.

[10.2 Effect]

In Modification 4 of the first embodiment, many paths may be provided for ejecting the gas in the chamber 2. This may lead to an increase in the total cross-sectional area of the paths related to the ejection of the gas. Consequently, the efficiency of ejecting the gas may be improved.

Since parts of the ejection paths 81 extend in the magnet bores 9c and 9d, the amount of gas ejected in the direction of the central axis O may be increased as in Modification 3 of the first embodiment. Thus, the suspended substances P contained in the gas can be efficiently ejected.

[11. Ports and Ejection Paths Included in EUV Light Generation device According to Modification 5 of First Embodiment]

[11.1 Configuration]

The configurations of the ports 80 and the ejection paths 81 included in an EUV light generation device 1 according to Modification 5 of the first embodiment will be described referring to FIGS. 8A and 8B.

Figure 8A:
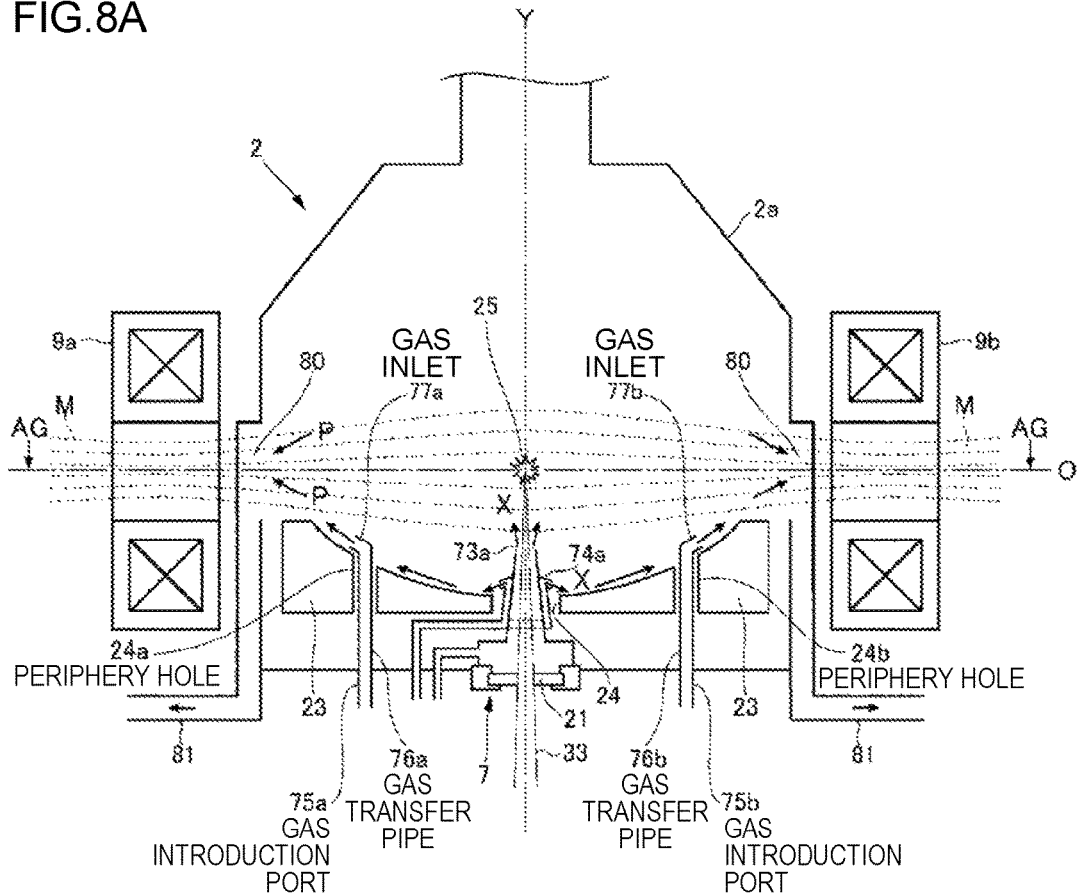
FIG. 8A is a diagram for explaining a configuration of an EUV light generation device according to Modification 5 of the first embodiment.

Here, FIG. 8A is a diagram for explaining the configuration of the EUV light generation device 1 according to Modification 5 of the first embodiment.

The EUV light generation device 1 according to Modification 5 of the first embodiment may differ from the EUV light generation device 1 according to the first embodiment illustrated in FIGS. 3A and 3B in that gas transfer pipes 76a and 76b may be configured to extend from the reflective surface of the EUV condenser mirror 23.

The configurations of the ports 80, ejection paths 81, the ejection device 82, and the magnetic field forming device 9 according to Modification 5 of the first embodiment may be similar to those in the EUV light generation device 1 according to the first embodiment illustrated in FIGS. 3A and 3B.

The description of the components of the EUV light generation device 1 according to Modification 5 of the first embodiment which are similar to those in the EUV light generation device 1 illustrated in FIGS. 3A and 3B will be omitted.

Figure 8B:
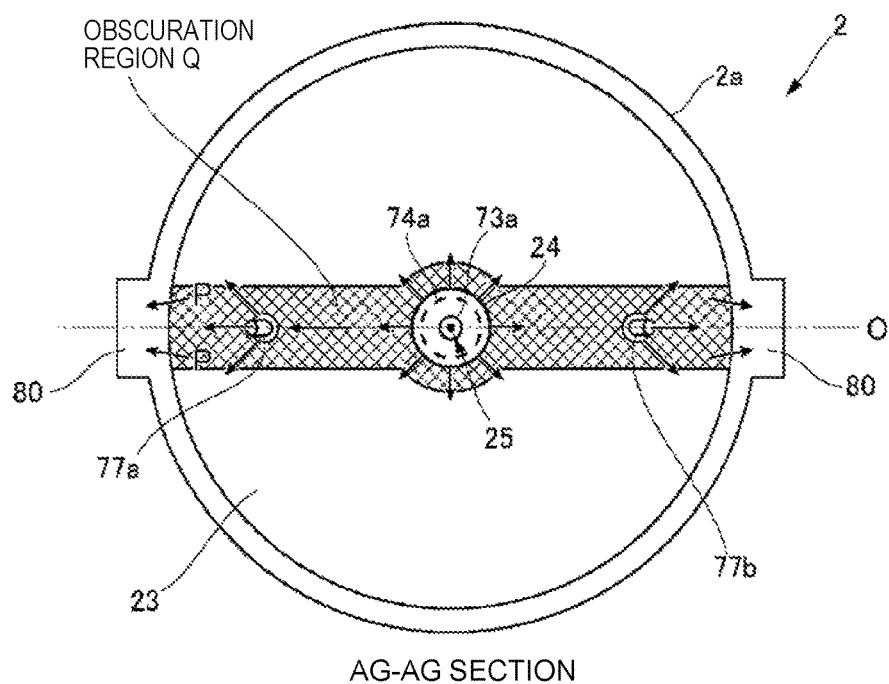
FIG. 8B is a cross-sectional view along a line AG-AG of a chamber illustrated in FIG. 8A.

FIG. 8B is a cross-sectional view along a line AG-AG of the chamber illustrated in FIG. 8A.

The EUV condenser mirror 23 may include, in addition to the through hole 24, periphery holes 24a and 24b passing through the EUV condenser mirror 23.

As illustrated in FIG. 8B, the periphery holes 24a and 24b may be provided in the reflective surface of the EUV condenser mirror 23 in positions arranged along the central axis O. The periphery holes 24a and 24b may preferably be provided on a line where a plane including the central axis O and the chamber central axis Y, which is the axis of emission of EUV light, intersects the reflective surface of the EUV condenser mirror 23.

In addition, the periphery holes 24a and 24b may be provided along with the through hole 24 in an obscuration region Q on the reflective surface of the EUV condenser mirror 23.

As illustrated in FIG. 8B, the periphery holes 24a and 24b may be provided in two portions in the reflective surface of the EUV condenser mirror 23.

The obscuration region Q may be an optical region unused in the exposure device 6 in the path passing from the first focus (plasma generation region 25) to the second focus (intermediate light collection point 292) of the EUV condenser mirror 23 through the reflective surface of the EUV condenser mirror 23.

The obscuration region Q may be a region in the path of the EUV light where components of the chamber 2 can be disposed without causing any problem in use of the exposure device 6.

The chamber 2 may contain gas introduction ports 75a and 75b and gas transfer pipes 76a and 76b.

The gas introduction port 75a may be connected to an etching gas source not illustrated. The gas introduction port 75a may be in communication with the gas transfer pipe 76a.

The gas introduction port 75b may be connected to the etching gas source not illustrated. The gas introduction port 75b may be in communication with the gas transfer pipe 76b.

The gas transfer pipe 76a may be provided in the periphery hole 24a of the EUV condenser mirror 23. The gas transfer pipe 76a may include a gas inlet 77a projecting from the periphery hole 24a.

The gas transfer pipe 76b may be provided in the periphery hole 24b of the EUV condenser mirror 23. The gas transfer pipe 76b may include a gas inlet 77b projecting from the periphery hole 24b.

The gas inlets 77a and 77b may be opened toward a portion where the magnetic lines of force M converge such that the etching gas X injected from the gas inlets 77a and 77b flows along the reflective surface of the EUV condenser mirror 23.

The etching gas X injected from the gas inlets 77a and 77b may flow toward the edge of the EUV condenser mirror 23.

The number of periphery holes 24a and 24b provided in the EUV condenser mirror 23 does not necessarily equal the number of gas transfer pipes 76a and 76b provided in the periphery holes 24a and 24b.

Here, a structure related to gas ejection and including the gas introduction ports 75a and 77b the gas transfer pipes 76a and 76b, and the gas inlets 77a and 77b is referred to as "second etching gas supply unit".

The configurations of the other components of the EUV light generation device 1 according to Modification 5 of the first embodiment may be similar to those in the EUV light generation device 1 according to the first embodiment illustrated in FIGS. 3A and 3B.

[11.2 Operation and Effect]

In Modification 5 of the first embodiment, the etching gas X may be supplied to the reflective surface of the EUV condenser mirror 23 through the gas transfer pipes 76a and 76b disposed in the periphery holes 24a and 24b in the EUV condenser mirror 23.

The etching gas X injected from the gas inlets 77a and 77b of the gas transfer pipes 76a and 76b may flow toward the edge of the EUV condenser mirror 23 along the reflective surface of the EUV condenser mirror 23 and the central axis O.

The etching gas X may react with debris N around the central axis O on the reflective surface of the EUV condenser mirror 23 which tends to catch the debris N generated in the chamber 2, thereby generating a reaction product.

In Modification 5 of the first embodiment, each inlet of the etching gas X has a larger cross-sectional area, which allows the etching gas X to be supplied to the chamber 2 at a higher flow rate. For this reason, embodiments and modifications that have been described above and will be described later can be used in any combination to increase the flow rate of the gas ejected from the chamber 2. In this case, the EUV light generation device 1 has a higher degree of flexibility in controlling the flow rates of the gas injected to and ejected from the chamber 2 and allows suspended substances P to be efficiently ejected.

The chamber 2 may further include a vacuum pump not illustrated. In this case, the vacuum pump may eject the gas at a flow rate that has little effect on the flow of the gas around the EUV condenser mirror 23.

[12. Ports and Ejection Paths Included in EUV Light Generation Device According to Modification 6 of First Embodiment]

[12.1 Configuration]

The configuration of an EUV light generation device 1 according to Modification 6 of the first embodiment will be described referring to FIGS. 9A to 9C.

Figure 9A:
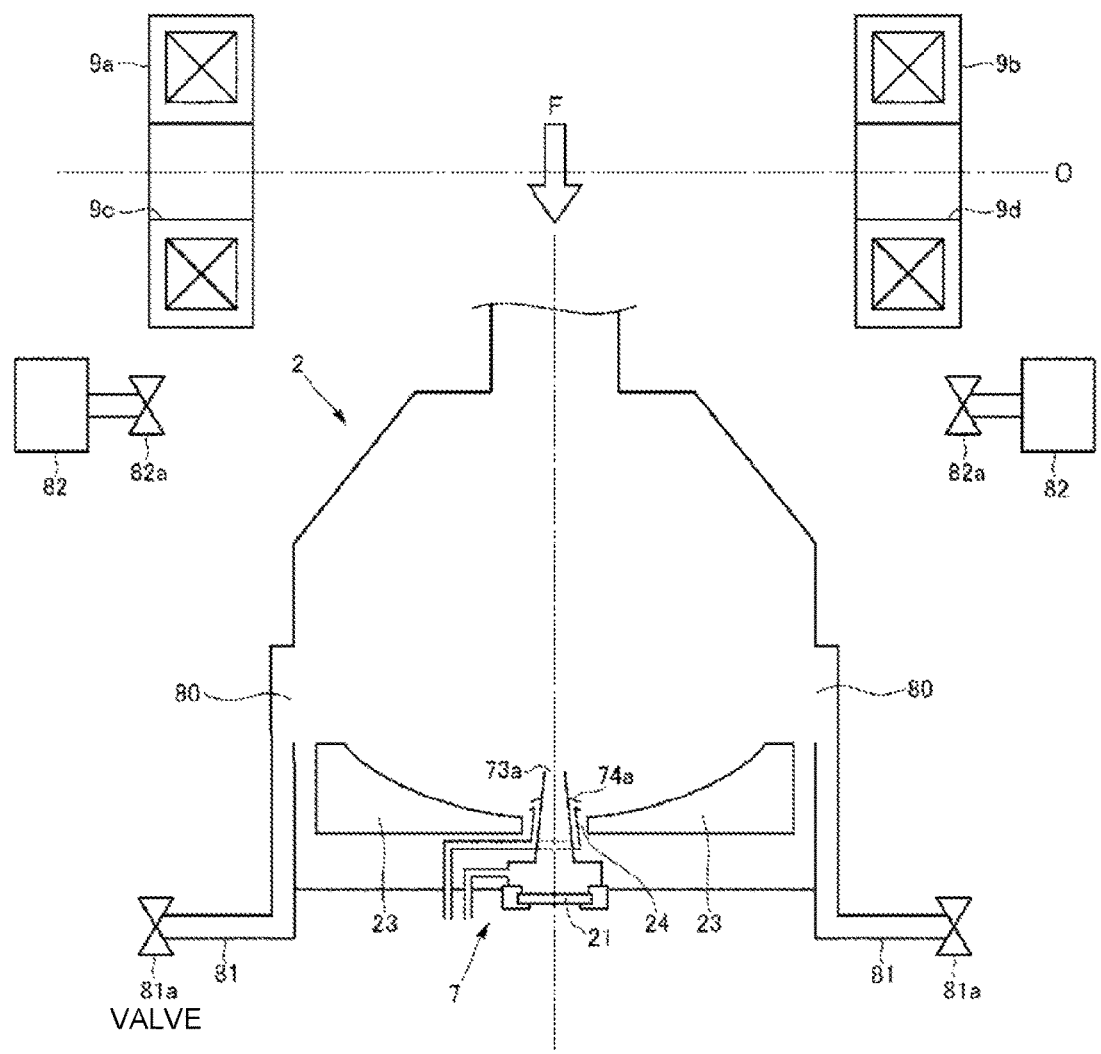
FIG. 9A is a diagram for explaining an EUV light generation device according to Modification 6 of the first embodiment, in which a chamber is moved away from a magnetic field forming device.

Here, FIG. 9A is a diagram for explaining the EUV light generation device 1 according to Modification 6 of the first embodiment in which the chamber 2 and the ejection paths 81 are moved away from the magnetic field forming device 9.

Figure 9B:
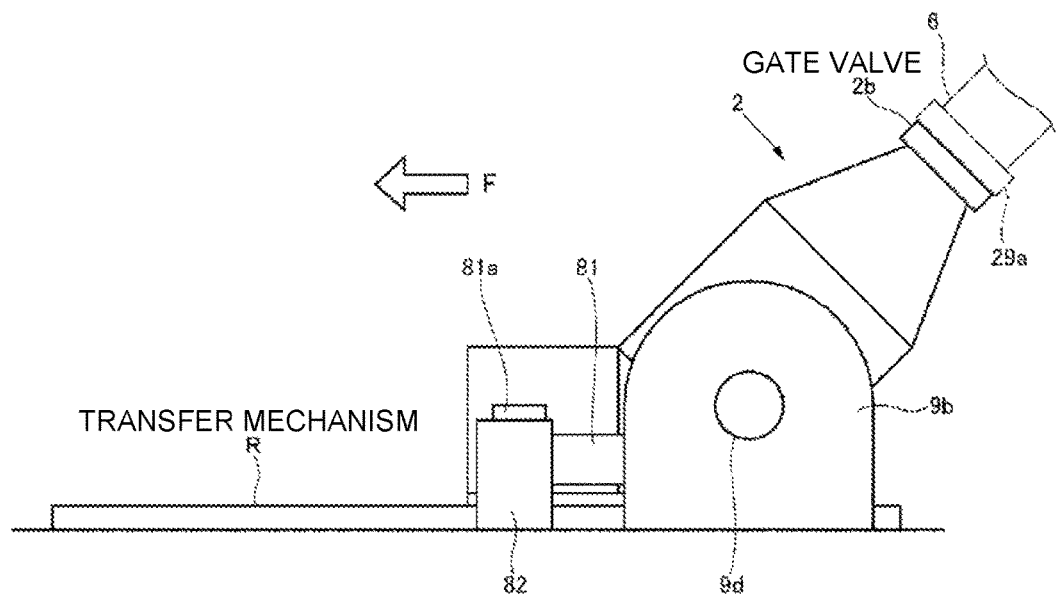
FIG. 9B illustrates the configuration of a transfer mechanism mounted to the chamber.

FIG. 9B is a diagram for explaining the state before the chamber 2 and the ejection paths 81 are moved.

Figure 9C:
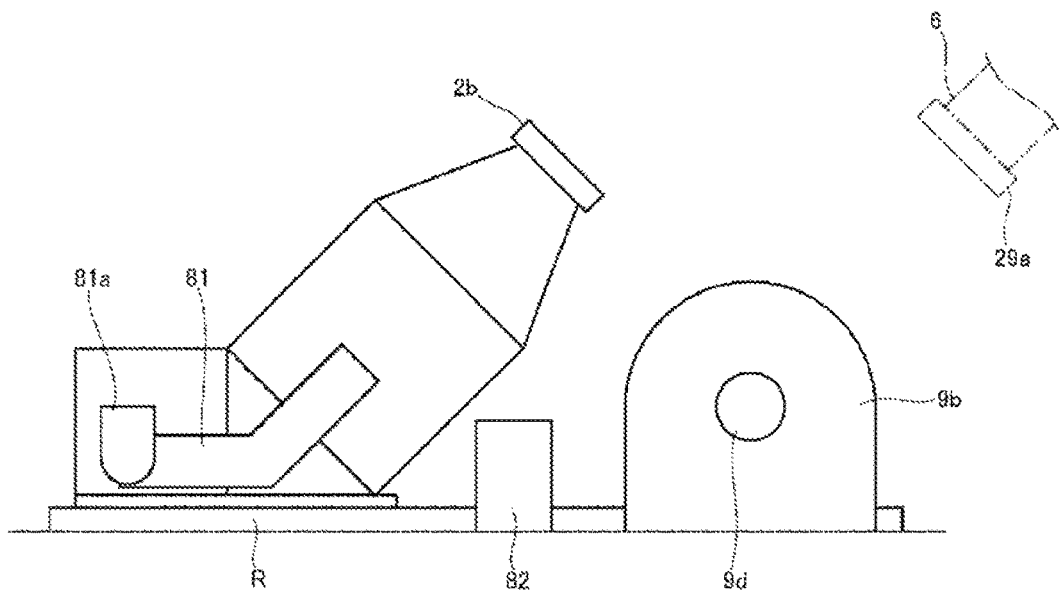
FIG. 9C is a diagram for explaining a state after the chamber is moved by the transfer mechanism.

FIG. 9C is a diagram for explaining the state after the chamber 2 and the ejection paths 81 are moved by the transfer mechanism R.

The EUV light generation device 1 according to Modification 6 of the first embodiment may differ from the EUV light generation device 1 according to the first embodiment illustrated in FIG. 3A in that the transfer mechanism R may be configured to move the chamber 2 and the ejection paths 81 away from the magnets 9a and 9b.

The configurations of the ports 80, the ejection paths 81, the ejection devices 82, and the magnetic field forming device 9 according to Modification 6 of the first embodiment may be similar to those in the EUV light generation device 1 according to the first embodiment illustrated in FIG. 3A.

The description of the components of the EUV light generation device 1 according to Modification 6 of the first embodiment which are similar to those in the EUV light generation device 1 illustrated in FIG. 3A will be omitted.

As illustrated in FIG. 9A, the chamber 2 may be movable from the magnets 9a and 9b and the ejection devices 82. The chamber 2 may be movable in a chamber moving direction F vertical to the central axis O of the magnetic field formed by the magnets 9a and 9b.

As illustrated in FIGS. 9B and 9C, the chamber 2 may include the transfer mechanism R.

The transfer mechanism R may include a rail. The chamber 2 may be movable on the rail.

The chamber 2 may include a gate valve 2b detachable from a gate valve 29a mounted on the connecting portion 29 of the exposure device 6. The open/close and attachment/detachment of the gate valves 29a and 2b may be performed by either the operator or the EUV light generation controller 5 through an actuator not illustrated.

Each ejection path 81 may include a valve 81a detachable from a valve 82a provided in the ejection path in the vicinity of the ejection device 82. The open/close and attachment/detachment of the valves 82a and 81a may be performed by either the operator or the EUV light generation controller 5 through an actuator not illustrated.

The configurations of the other components of the EUV light generation device 1 according to Modification 6 of the first embodiment may be similar to those in the EUV light generation device 1 according to the first embodiment illustrated in FIG. 3A.

[12.2 Operation and Effect]

The gate valve 29a, the gate valve 2b, the valves 81a, and the valves 82a may be closed during maintenance. Afterwards, a connection between the gate valve 29a and the gate valve 2b may be released to release the chamber 2 from the connecting portion 29 of the exposure device 6. The release of a connection between the valves 81a and the valves 82a may release the ejection paths 81 from the ejection devices 82.

The released chamber 2 and the ejection paths 81 may be moved by the operation of the transfer mechanism R. Thus, the chamber 2 and the ejection paths 81 may be separated from the magnets 9a and 9b by the operation of the transfer mechanism R.

In the EUV light generation device, moving the chamber 2 and the ejection paths 81 may ensure a space between the magnet 9a and the magnet 9b. Thus, the EUV light generation device may ensure a space for the maintenance of the chamber 2 and the magnets 9a and 9b.

[13. Port and Ejection Path Included in EUV Light Generation Device According to Second Embodiment]

[13.1 Configuration]

The configurations of the port 80 and the ejection path 81 included in an EUV light generation device 1 according to the second embodiment will be described referring to FIGS. 10A to 10C.

Figure 10A:
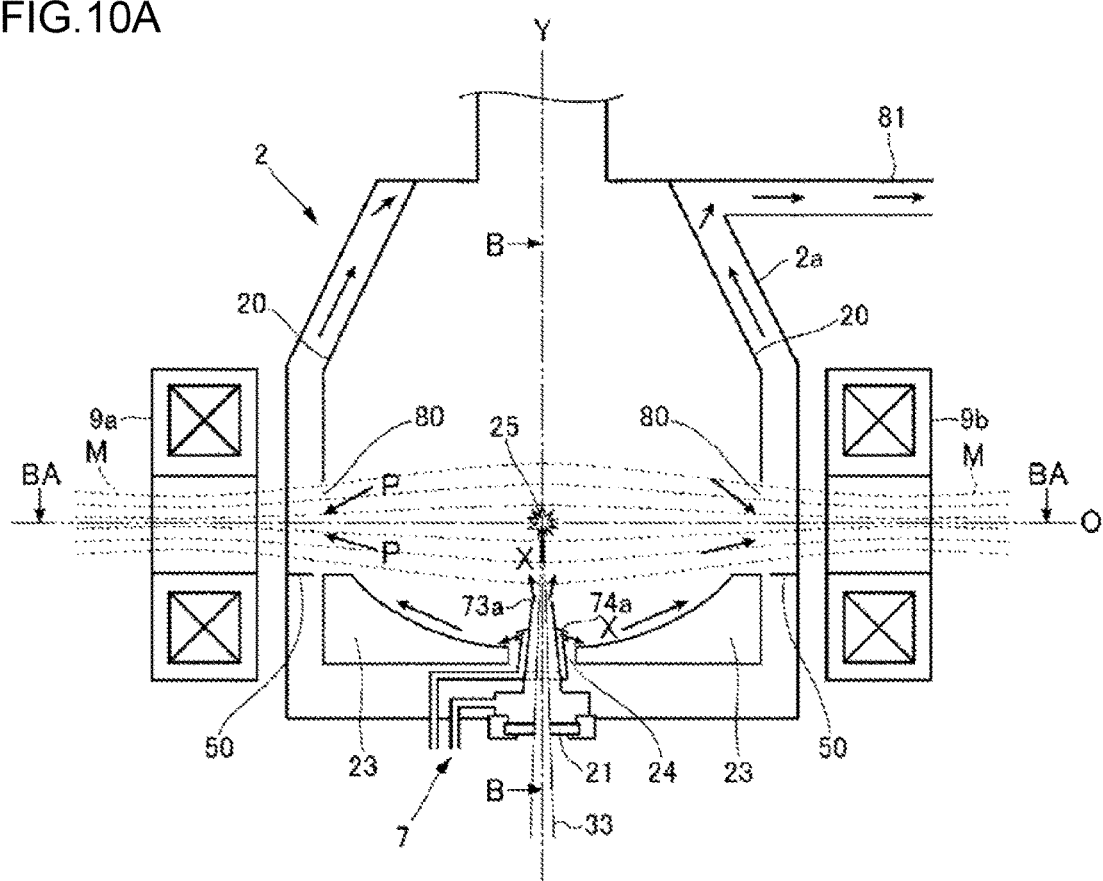
FIG. 10A is a diagram for explaining a configuration of an EUV light generation device according to a second embodiment.

Here, FIG. 10A is a diagram for explaining the configuration of the EUV light generation device 1 according to the second embodiment.

Figure 10B:
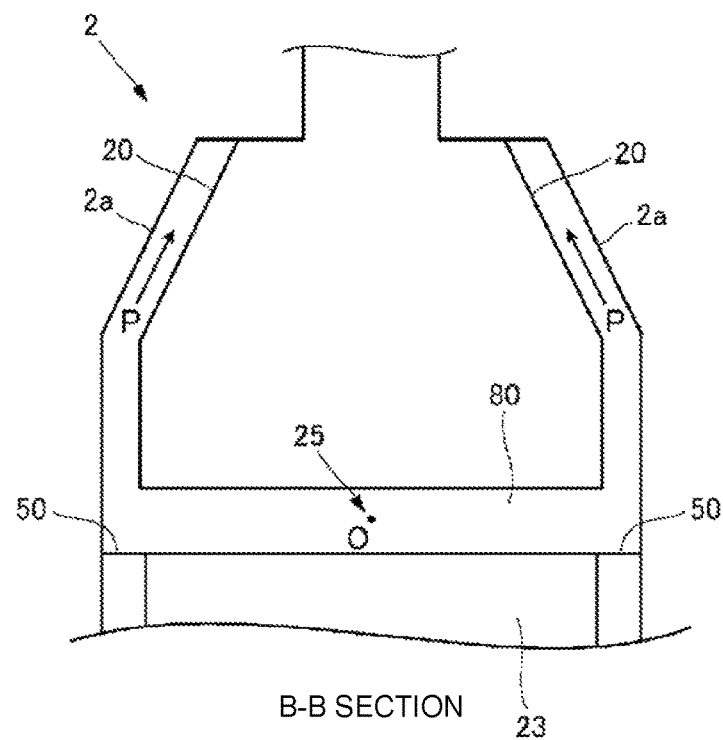
FIG. 10B is a cross-sectional view along a line B-B of the chamber illustrated in FIG. 10A.

FIG. 10B is a cross-sectional view along a line B-B of the chamber illustrated in FIG. 10A.

Figure 10C:
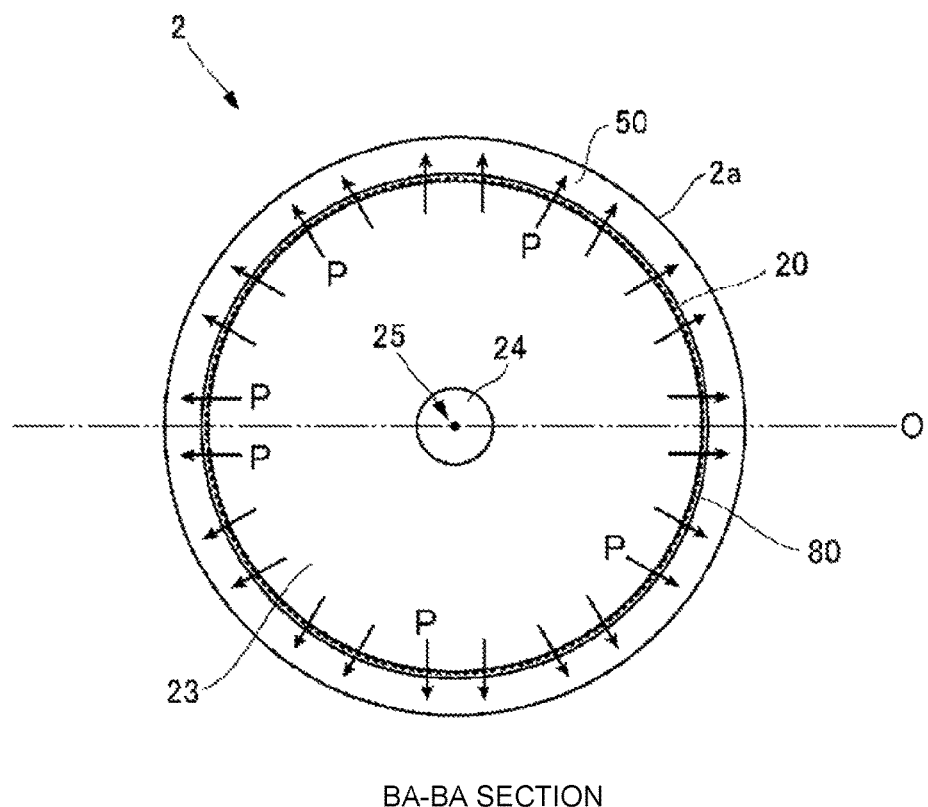
FIG. 10C is a cross-sectional view along a line BA-BA of the chamber illustrated in FIG. 10A.

FIG. 10C is a cross-sectional view along a line BA-BA of the chamber illustrated in FIG. 10A.

It should be noted that the gas supply unit 7 is omitted in FIGS. 10B and 10C.

The EUV light generation device 1 according to the second embodiment may differ from the EUV light generation device 1 according to Modification 1 of the first embodiment illustrated in FIGS. 4A to 4D in that the port 80 may be provided on the division wall 20 in the form of slits.

The configurations of the ejection path 81, the ejection device 82, and the magnetic field forming device 9 according to the second embodiment may be similar to those in the EUV light generation device 1 according to Modification 1 of the first embodiment illustrated in FIGS. 4A to 4D.

The description of the components of the EUV light generation device 1 according to the second embodiment which are similar to those in the EUV light generation device 1 illustrated in FIGS. 4A to 4D will be omitted.

The port 80 may be provided as slits around the entire perimeter of the division wall 20 in the chamber 2 along the edge of EUV condenser mirror 23.

The chamber 2 may include a flange 50 inside around the entire perimeter of the chamber 2 around the EUV condenser mirror 23.

As illustrated in FIG. 10A, the ejection path 81 may contain a predetermined space defined by the chamber wall 2a, the division wall 20, and the flange 50 and be connected to the port 80 in the form of slits around the entire perimeter of the division wall 20. The ejection path 81 may be connected to both the port 80 in the form of slits and the ejection device 82.

As illustrated in FIGS. 10A and 10C, suspended substances P generated in the chamber 2 may be taken into the slits of the port 80 in the division wall 20. As illustrated in FIG. 10B, the suspended substances P taken into the port 80 may flow through the path defined by the chamber wall 2a, the division wall 20, and the flange 50. Afterwards, as illustrated in FIG. 10A, the suspended substances P may flow toward the ejection device 82 not illustrated through the ejection path 81.

The configurations of the other components of the EUV light generation device 1 according to the second embodiment may be similar to those in the EUV light generation device 1 according to Modification 1 of the first embodiment illustrated in FIGS. 4A to 4D.

[13.2 Effect]

On the entire surface of the EUV condenser mirror 23, the etching gas X may flow from the center to the entire perimeter of the edge of the EUV condenser mirror 23.

The etching gas X may be blown on the entire reflective surface of the EUV condenser mirror 23 having the debris N thereon.

For the etching gas X, the cross-sectional area of the flow path passing the port 80 can be increased. Accordingly, the flow rate of the etching gas X injected to the chamber 2 can be increased.

Thus, the EUV light generation device 1 can efficiently eject the gas containing suspended substances P.

[14. Ports and Ejection Path Included in EUV Light Generation Device According to Modification of Second Embodiment]

[14.1 Configuration]

The configurations of the ports 80 and the ejection path 81 included in an EUV light generation device 1 according to a modification of the second embodiment will be described referring to FIGS. 11A to 11C.

Figure 11A:
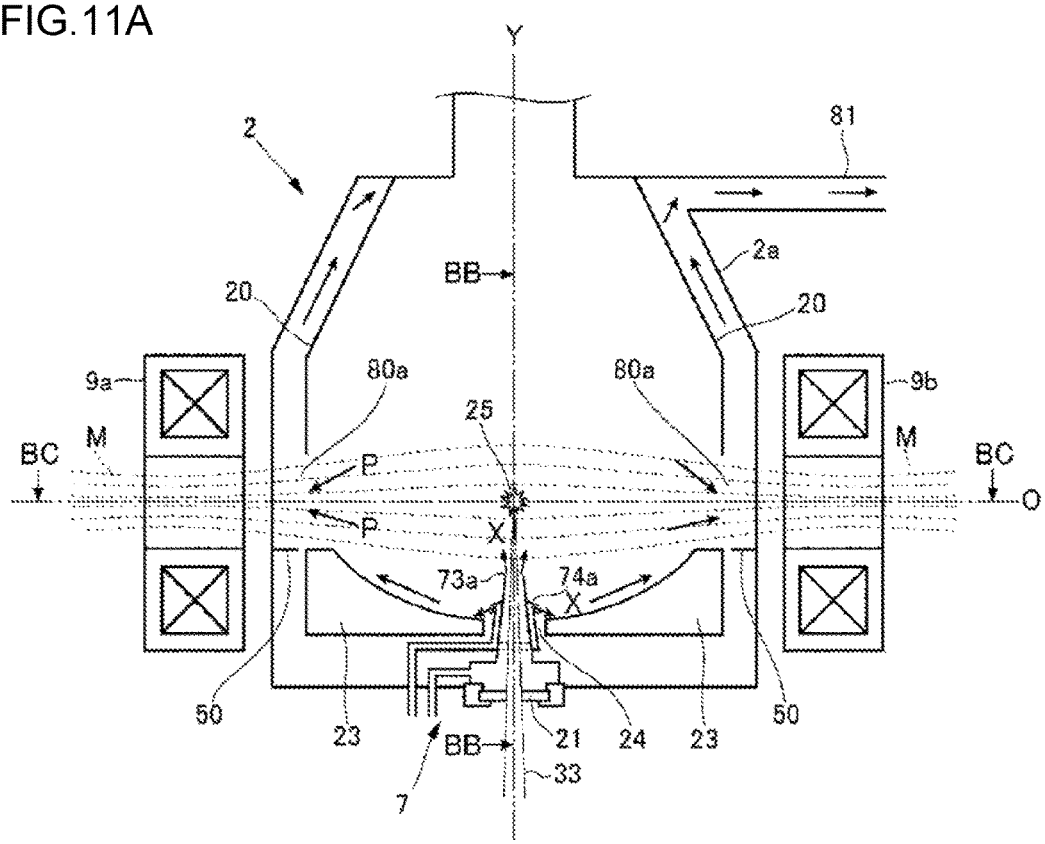
FIG. 11A is a diagram for explaining a configuration of an EUV light generation device according to a modification of the second embodiment.

Here, FIG. 11A is a diagram for explaining the configuration of the EUV light generation device 1 according to the modification of the second embodiment.

Figure 11B:
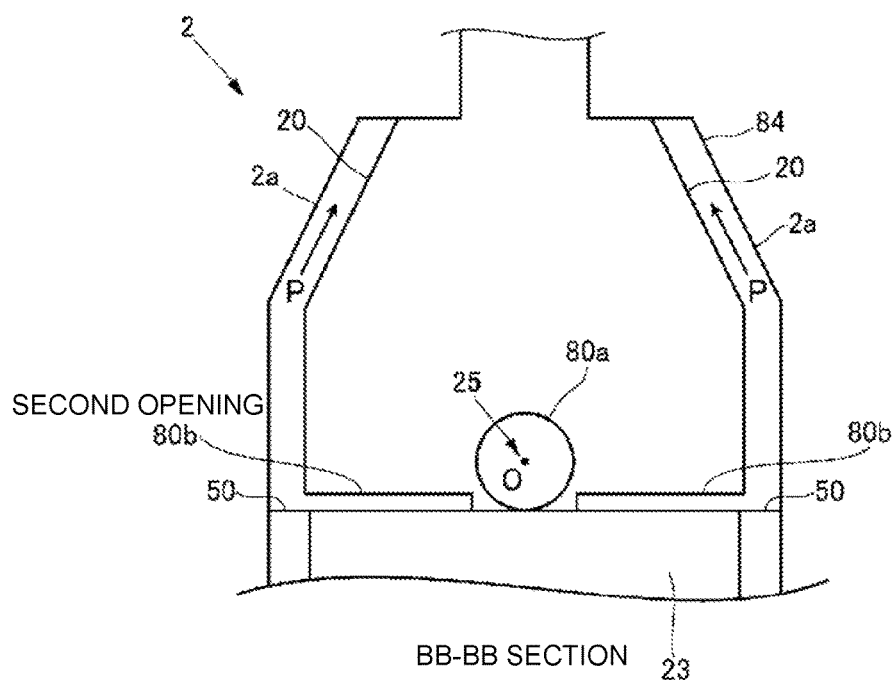
FIG. 11B is a cross-sectional view along a line BB-BB of the chamber illustrated in FIG. 11A.

FIG. 11B is a cross-sectional view along a line BB-BB of the chamber illustrated in FIG. 11A.

Figure 11C:
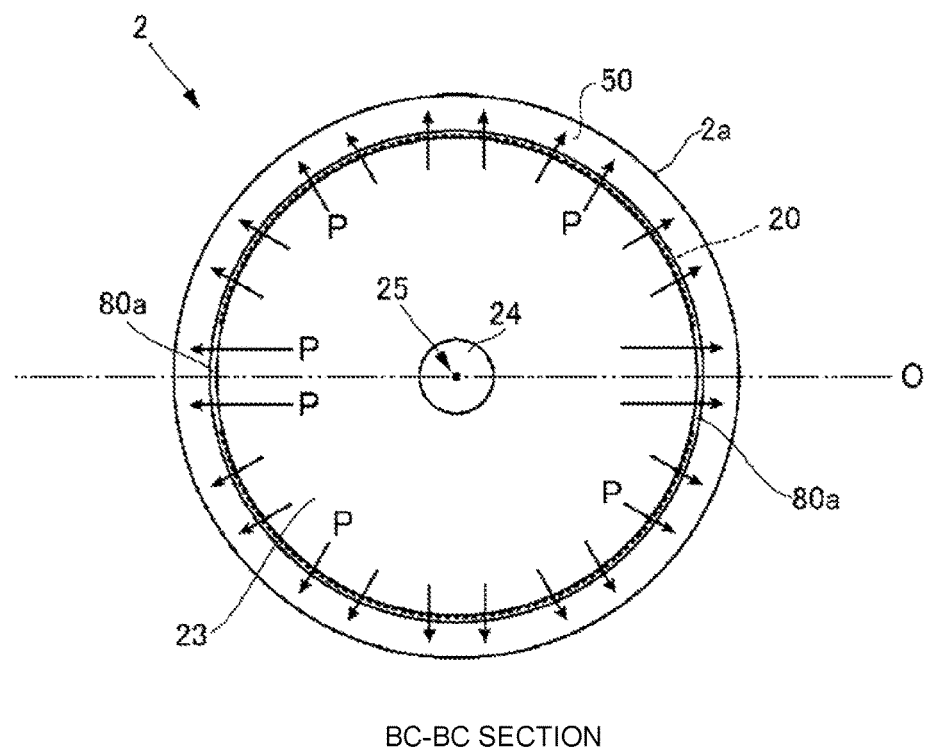
FIG. 11C is a cross-sectional view along a line BC-BC of the chamber illustrated in FIG. 11A.

FIG. 11C is a cross-sectional view along a line BC-BC of the chamber illustrated in FIG. 11A.

It should be noted that the gas supply unit 7 is omitted in FIGS. 11B and 11C.

The EUV light generation device 1 according to the modification of the second embodiment may differ from the EUV light generation device 1 according to Modification 1 of the first embodiment illustrated in FIG. 4A in that first openings 80a are provided in the division wall 20 and second openings 80b are provided in the division wall 20 in the form of slits.

The configurations of the ejection path 81, the ejection device 82, and the magnetic field forming device 9 according to the modification of the second embodiment may be similar to those in the EUV light generation device 1 according to Modification 1 of the first embodiment illustrated in FIG. 4A.

The description of the components of the EUV light generation device 1 according to the modification of the second embodiment which are similar to those in the EUV light generation device 1 illustrated in FIG. 4A will be omitted.

As illustrated in FIG. 11A, the chamber 2 may include the division wall 20 inside of the chamber wall 2a. As illustrated in FIG. 11A, the chamber 2 may include the flange 50 around the EUV condenser mirror 23 inside of the chamber 2. In the chamber 2, a predetermined space may be defined by the chamber wall 2a, the division wall 20, and the flange 50.

As illustrated in FIG. 11B, the division wall 20 may have a plurality of openings: the first openings 80a and the second openings 80b.

As the ports 80 that have been described referring to FIG. 3B, the first openings 80a may be provided in the division wall 20 in positions substantially matching the positions of the magnet bore 9c of the magnet 9a and the magnet bore 9d of the magnet 9b outside of the chamber 2 in the direction of the central axis O of the magnetic field. The first openings 80a may be provided in the division wall 20 in a position where magnetic lines of force M of the magnetic field formed by the magnets 9a and 9b converge.

The second openings 80b may be provided around almost the entire perimeter of the division wall 20 except for the positions of the first openings 80a. The second openings 80b may be provided in the forms of slits along the surface of the division wall 20 in the chamber 2 and along the edge of EUV condenser mirror 23.

As illustrated in FIGS. 11A and 11B, the ejection path 81 may contain a predetermined space defined by the chamber wall 2a, the division wall 20, and the flange 50 and be connected to the first openings 80a and the second openings 80b. The ejection path 81 may be connected to the first opening 80a provided in a position where the magnetic lines of force M converge, the second openings 80b in the form of slits, and the ejection device 82.

As illustrated in FIGS. 11B and 11C, the suspended substances P generated in the chamber 2 may be taken into the first openings 80a and the second openings 80b in the division wall 20. As illustrated in FIG. 11B, the suspended substances P taken into the first openings 80a and the second openings 80b may flow through the predetermined space defined by the chamber wall 2a, the division wall 20, and the flange 50. As illustrated in FIG. 11A, the suspended substances P flowing through the predetermined space which is part of the ejection path 81 may flow toward the ejection device 82 not illustrated.

The configurations of the other components of the EUV light generation device 1 according to the modification of the second embodiment may be similar to those in the EUV light generation device 1 according to Modification 1 of the first embodiment illustrated in FIG. 4A.

[14.2 Effect]

The etching gas X may flow substantially uniformly on the entire surface of the EUV condenser mirror 23.

The flow rate of the etching gas X injected to the chamber 2 can be increased. Thus, the EUV light generation device 1 can efficiently eject the gas containing suspended substances P to the outside of the chamber 2.

Further, suspended substances P containing debris N do not build up in the chamber 2 and may be collectively ejected to the outside of the chamber 2.

[15. Port and Ejection Path Included in EUV Light Generation Device According to Third Embodiment]

[15.1 Configuration]

The configurations of the port 80 and the ejection path 81 included in an EUV light generation device 1 according to the third embodiment will be described referring to FIGS. 12A and 12B.

Figure 12A:
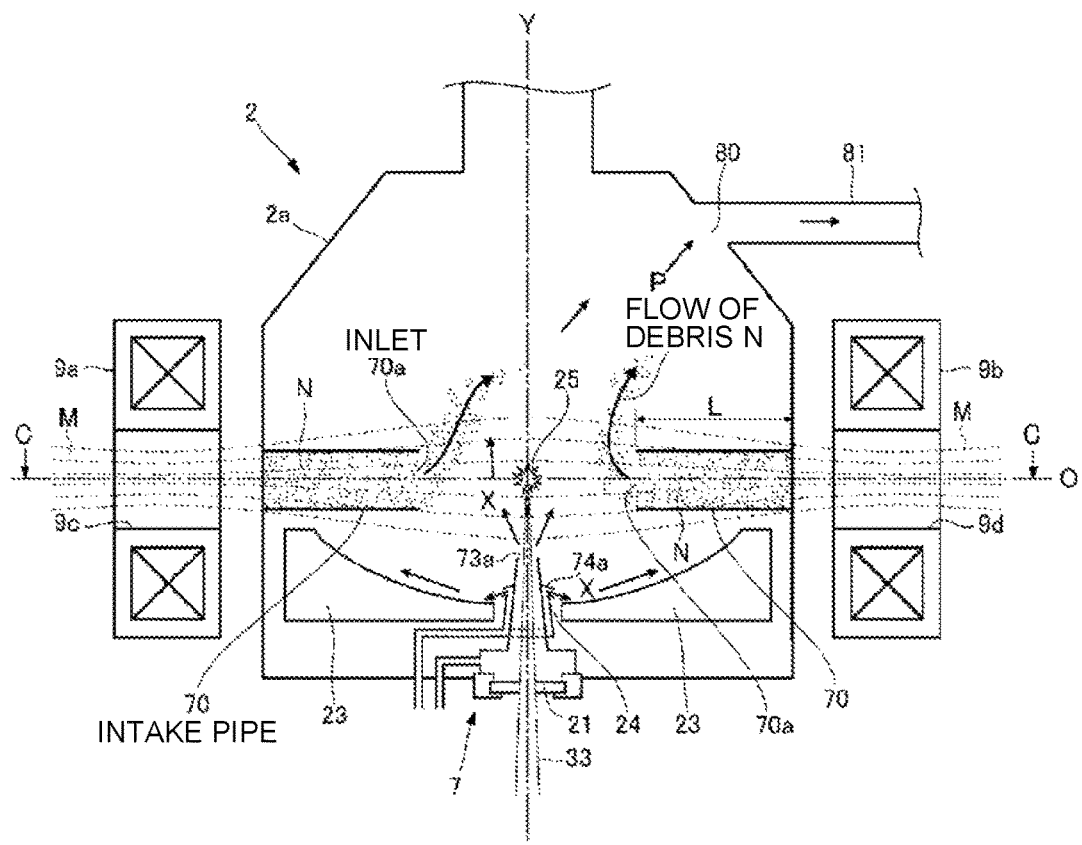
FIG. 12A is a diagram for explaining a configuration of an EUV light generation device according to a third embodiment.

Here, FIG. 12A is a diagram for explaining the configuration of the EUV light generation device 1 according to the third embodiment.

Figure 12B:
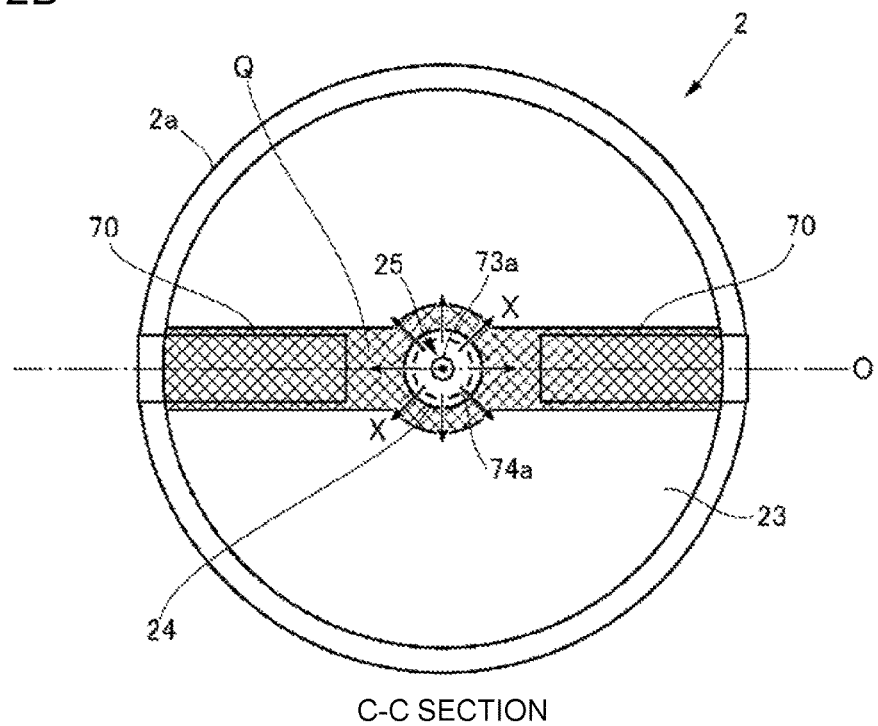
FIG. 12B is a cross-sectional view along a line C-C of the chamber illustrated in FIG. 12A.

FIG. 12B is a cross-sectional view along a line C-C of the chamber illustrated in FIG. 12A.

The EUV light generation device 1 according to the third embodiment may include intake pipes 70 to temporarily take in suspended substances P in the chamber 2.

The configurations of the ejection path 81, the ejection device 82, and the magnetic field forming device 9 according to the third embodiment may be similar to those in the EUV light generation device 1 illustrated in FIG. 2.

The configuration of the port 80 according to the third embodiment may be similar to that of the ejection port 8 in the EUV light generation device 1 illustrated in FIG. 2.

The description of the components of the EUV light generation device 1 according to the third embodiment which are similar to those in the EUV light generation device 1 illustrated in FIG. 2 will be omitted.

The chamber 2 may include the intake pipes 70 for temporarily taking in suspended substances P in the chamber 2.

The intake pipes 70 may temporarily take in suspended substances P, particularly ions S generated in the plasma generation region 25.

As illustrated in FIG. 12A, one end of the intake pipe 70 may be fixed to the inner side of the chamber wall 2a, and the other end may be blocked.

The intake pipe 70 may be disposed in the chamber 2 such that an inlet 70a for taking in suspended substances P is directed at the plasma generation region 25.

The intake pipe 70 may be disposed in the chamber 2 such that its longitudinal direction may be substantially parallel to the direction of the central axis O.

The intake pipe 70 may be grounded not to be charged by a contact with ions S generated in the chamber 2. The grounded intake pipe 70 can take in ions S from the inlet 70a without causing reactions from ions S generated by charging.

When the chamber 2 is grounded, the intake pipe 70 may be electrically connected to the chamber 2.

For the intake pipe 70, the length L from one end fixed to the inner side of the chamber 2 to the other end, i.e., the inlet 70a may be, for example, 70 mm. The length L may be in the range of 30 mm to 300 preferably 50 mm to 150 mm Here, the configurations of the gas transfer pipes 76a and 76b according to Modification 5 of the first embodiment may be added to the third Embodiment including the intake pipe 70.

In this case, for the etching gas X injected from the gas inlets 77a and 77b, the gas flow from the reflective surface of the EUV light condenser mirror 23 toward the port 80 may be promoted. Accordingly, the suspended substances P near the inlet 70a can be efficiently transported to the port 80 in the chamber 2.

As illustrated in FIG. 12B, the intake pipe 70 may be disposed in a position on the central axis O on the reflective surface of the EUV condenser mirror 23.

The intake pipe 70 may be disposed in a region corresponding to the obscuration region Q.

The configurations of the other components of the EUV light generation device 1 according to the third embodiment may be similar to those in the EUV light generation device 1 according to the embodiment illustrated in FIG. 2.

[15.2 Operation]

Almost all the ions S generated in the plasma generation region 25 may be accumulated along the central axis O by the effects of the magnetic lines of force M of the magnetic field formed by the magnets 9a and 9b and may be taken from the inlets 70a of the intake pipes 70 into the intake pipes 70.

The ions S taken into the intake pipes 70 collide with the etching gas X taken into the intake pipes 70 and deactivate, thus building up in the intake pipes 70.

Part of the ions S building up in the intake pipes 70 may adhere to the inside of intake pipes 70 when neutralized due to collision with the etching gas X. Tin atoms or neutral tin generated inside by sputtering may go out from the inlets 70*a* and flow in the chamber 2.

The debris N coming out of the inlets 70*a* may move with the flow of the etching gas X moving from the cone opening 73*a* to the port 80 in the chamber 2, and may move away from the EUV condenser mirror 23.

The debris N moving away from the EUV condenser mirror 23 may be ejected from the port 80 to the outside of the chamber 2 through the ejection path 81.

[15.3 Effect]

If the ions S are neutralized while high energy is held by recombination with electrons or charge exchange with other particles before they deactivate due to collision and build up, the ions S may diffuse against the flow of the etching gas and collide with the EUV condenser mirror 23. At this time, the presence of the intake pipes 70 may suppress the diffusion.

When going out through the inlets 70*a*, the other debris N building up in the intake pipes 70 may move toward the port 80 along the flow of the etching gas X coming from the cone opening 73*a*.

The debris N flowing to the port 80 may be ejected from the port 80 to the outside of the chamber 2 through the ejection path 81.

[16. Ports and Ejection Paths Included in EUV Light Generation Device According to Fourth Embodiment]

[16.1 Configuration]

The configurations of the ports 80 and the ejection paths 81 included in an EUV light generation device 1 according to the fourth embodiment will be described referring to FIG. 13.

Figure 13:
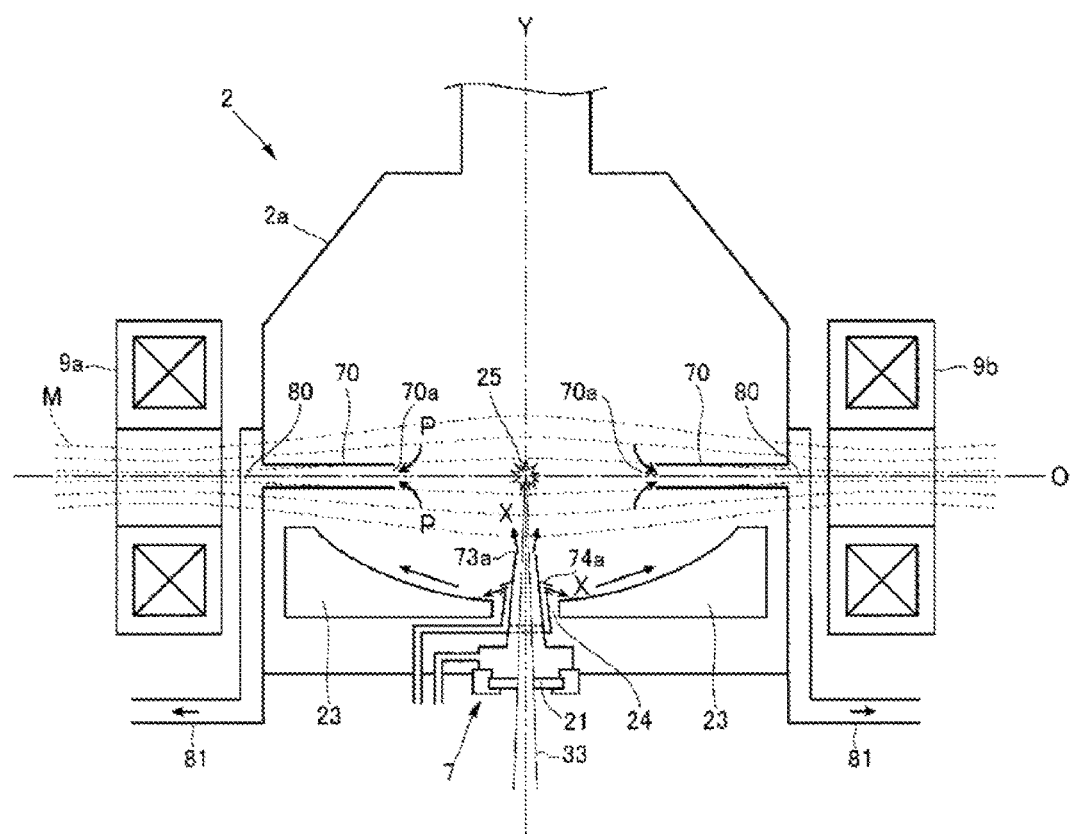
FIG. 13 is a diagram for explaining a configuration of an EUV light generation device according to a fourth embodiment.

Here, FIG. 13 is a diagram for explaining the configuration of the EUV light generation device 1 according to the fourth embodiment.

The EUV light generation device 1 according to the fourth embodiment may differ from the EUV light generation device 1 according to the first embodiment illustrated in FIG. 3A in that the interiors of the intake pipes 70 are in communication with the ports 80.

The configurations of the ports 80, the ejection paths 81, the ejection device 82, and the magnetic field forming device 9 according to the fourth embodiment may be similar to those in the EUV light generation device 1 according to the first embodiment illustrated in FIG. 3A.

The description of the components of the EUV light generation device 1 according to the fourth embodiment which are similar to those in the EUV light generation device 1 illustrated in FIG. 3A will be omitted.

The chamber 2 may include the intake pipes 70 for taking in suspended substances P generated in the chamber 2.

As illustrated in FIG. 13, the intake pipe 70 may take in suspended substances P from one end, i.e., the inlet 70*a*. The other end of the intake pipe 70 may be in communication with the port 80.

The intake pipe 70 may be disposed in the chamber 2 such that the inlet 70*a* for taking in suspended substances P is directed at the plasma generation region 25.

The intake pipe 70 may be disposed in the chamber 2 such that its longitudinal direction may be substantially parallel to the direction of the central axis O.

As in the configuration described in the third embodiment, the intake pipe 70 may be grounded not to be charged by a contact with ions S generated in the chamber 2. The grounded intake pipe 70 can take in ions S from the inlet 70*a* without causing reactions from ions S generated by charging.

When the chamber 2 is grounded, the intake pipe 70 may be electrically connected to the chamber 2.

As in the configuration described in the third embodiment, for the intake pipe 70, the length L from one end fixed to the inner side of the chamber 2 to the other end, i.e., the inlet 70*a* may be, for example, 70 mm. The length L may be in the range of 30 mm to 300 mm, preferably 50 mm to 100 mm The intake pipes 70 according to the fourth embodiment, which are omitted in the drawing, may be provided in a region corresponding to the obscuration region Q of the reflective surface of the EUV condenser mirror 23.

The configurations of the other components of the EUV light generation device 1 according to the fourth embodiment may be similar to those in the EUV light generation device 1 according to the first embodiment illustrated in FIG. 3A.

The EUV light generation device 1 according to the fourth embodiment may include gas introduction ports 75*a* and 75*b*, gas transfer pipes 76*a* and 76*b*, and gas inlets 77*a* and 77*b*, which are collectively called "the second etching gas supply unit" as explained in Modification 5 of the first embodiment.

In this case, "the first etching gas supply unit" and "the second etching gas supply unit" may be provided in a region corresponding to the obscuration region Q of the reflective surface of the EUV condenser mirror 23.

[16.2 Operation]

Almost all the ions S generated in the plasma generation region 25 may be accumulated along the central axis O by the effects of the magnetic lines of force M of the magnetic field formed by the magnets 9*a* and 9*b* and may be taken from the inlets 70*a* into the intake pipes 70.

The ions S may collide with the etching gas X and deactivate while floating in the intake pipes 70.

Part of the debris N going through the intake pipes 70 may adhere to the inside of the intake pipes 70.

The other debris N may be ejected to the outside of the chamber 2 without adhering to the inside of the intake pipes 70 through the ejection path 81 in communication with the intake pipes 70.

Ions S floating in the intake pipes 70 without colliding with the etching gas X may also be ejected to the outside of the chamber 2 through the ejection path 81 in communication with the intake pipes 70.

The debris N generated in the chamber 2, the etching gas X not reacting with debris N, and a reaction product generated by a reaction between the debris N and the etching gas X may also be taken from the inlets 70*a* into the intake pipes 70 and ejected to the outside of the chamber 2 through the ejection path 81 in communication with the intake pipes 70.

[16.3 Effect]

Suspended substances P can be efficiently taken into the intake pipes 70. Thus, the diffusion of suspended substances P in the chamber 2 again can be suppressed. This can suppress adhesion of the suspended substances P to the reflective surface of the EUV condenser mirror 23.

[17. Ports and Ejection Paths Included in EUV Light Generation Device According to Modification 1 of Fourth Embodiment]

[17.1 Configuration]

The configurations of the ports 80 and the ejection paths 81 included in an EUV light generation device 1 according to Modification 1 of the fourth embodiment will be described referring to FIGS. 14A and 14B.

Figure 14A:
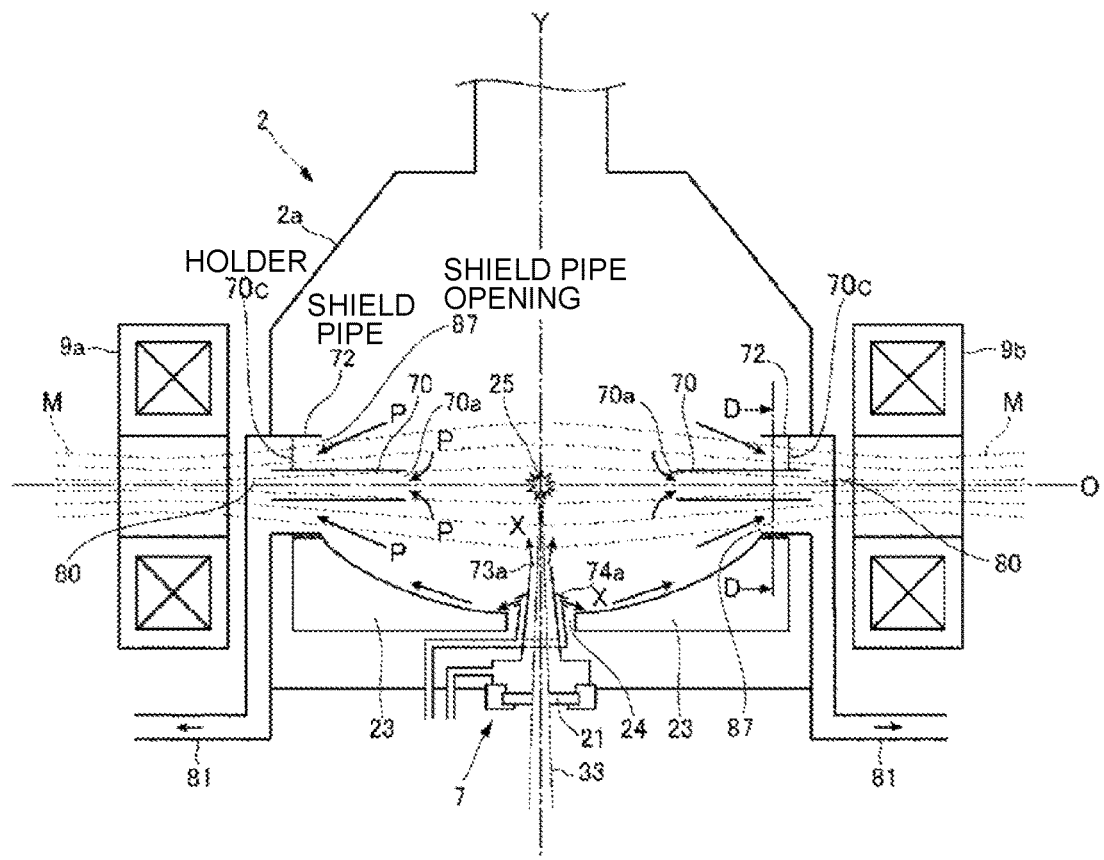
FIG. 14A is a diagram for explaining a configuration of an EUV light generation device according to Modification 1 of the fourth embodiment.

Here, FIG. 14A is a diagram for explaining the configuration of the EUV light generation device according to Modification 1 of the fourth embodiment.

Figure 14B:
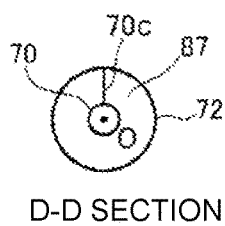
FIG. 14B is a cross-sectional view along a line D-D of a chamber illustrated in FIG. 14A.

FIG. 14B is a cross-sectional view along a line D-D of the chamber illustrated in FIG. 14A.

It should be noted that the EUV condenser mirror 23 is omitted in FIG. 14B.

The EUV light generation device 1 according to Modification 1 of the fourth embodiment may differ from the EUV light generation device 1 according to the fourth embodiment illustrated in FIG. 13 in that the interiors of the gas introduction port (shield pipes) 72 and the interiors of the intake pipes 70 are in communication with the ports 80.

The configurations of the intake pipes 70, the ports 80, the ejection paths 81, the ejection device 82, and the magnetic field forming device 9 according to Modification 1 of the fourth embodiment may be similar to those in the EUV light generation device 1 according to the fourth embodiment illustrated in FIG. 13.

The description of the components of the EUV light generation device 1 according to Modification 1 of the fourth embodiment which are similar to those in the EUV light generation device 1 illustrated in FIG. 13 will be omitted.

The chamber 2 may include intake pipes 70 and shield pipes 72 for taking in suspended substances P generated in the chamber 2.

As in the fourth embodiment, the intake pipes 70 according to Modification 1 of the fourth embodiment may be provided in a region corresponding to the obscuration region Q of the reflective surface of the EUV condenser mirror 23.

As illustrated in FIG. 14A, the intake pipe 70 may take in suspended substances P from one end, i.e., the inlet 70a. The intake pipe 70 may particularly take in ions S generated in the plasma generation region 25 and the etching gas X from the inlet 70a.

The ions S taken into the intake pipes 70 from the inlets 70a may collide and/or react with the etching gas X which is also taken into the intake pipes 70. Accordingly, the ions S may partly become neutralized ions S and/or a reaction product while going through the intake pipes 70.

As illustrated in FIG. 14A, the shield pipe 72 may be disposed surrounding the other end of the intake pipe 70. The shield pipe 72 may be disposed such that a shield pipe opening 87 is provided between the end of the intake pipe 70 opposite to the inlet 70a and the pipe portion of the shield pipe 72.

The longitudinal length of the shield pipe 72 may be smaller than that of the intake pipe 70.

The shield pipes 72 may be disposed outside the region in the optical path passing from the first focus (the plasma generation region 25) to the second focus (the intermediate light collection point 292) of the EUV condenser mirror 23 via the reflective surface of the EUV condenser mirror 23.

Like the intake pipes 70, when the shield pipes 72 are disposed in the region in the optical path on the EUV condenser mirror 23, they may reside in the obscuration region Q.

The shield pipes 72 may take in suspended substances P from the shield pipe openings 87. The shield pipes 72 may particularly take in debris N floating around the reflective surface of the EUV condenser mirror 23, a product of reaction between debris N and the etching gas X, and the etching gas X not reacting with debris N from the shield pipe openings 87.

As illustrated in FIG. 14B, the intake pipes 70 may be held coaxially with the shield pipes 72 in the shield pipes 72 having an inner diameter larger than the outer diameter of the intake pipes 70. Each intake pipe 70 may be held in the shield pipe 72 with a plate-like or rod-like holder 70c. Note that the holder 70c may be provided in more than one portion.

The holder 70c may hold the intake pipe 70 and the shield pipe 72 separated so that the gas can easily flow in the longitudinal direction of the shield pipe 72.

It should be noted that a plurality of shield pipes 72 may be used; particularly, a number of shield pipes 72 may be nested to form a multilayer structure.

The configurations of the other components of the EUV light generation device 1 according to Modification 1 of the fourth embodiment may be similar to those in the EUV light generation device 1 according to the fourth embodiment illustrated in FIG. 13.

The EUV light generation device 1 according to Modification 1 of the fourth embodiment may include gas introduction ports 75a and 75b, gas transfer pipes 76a and 76b, and gas inlets 77a and 77b, which are collectively called "the second etching gas supply unit" as explained in Modification 5 of the first embodiment.

In this case, "the first etching gas supply unit" and "the second etching gas supply unit" may be provided in a region corresponding to the obscuration region Q of the reflective surface of the EUV condenser mirror 23.

[17.2 Effect]

Since the shield pipes 72 are shorter than the intake pipes 70, the flow of the gas from the inside to the outside of the chamber 2 can be promoted in a portion where the magnetic lines of force M converge.

Consequently, the etching gas X, stannane gas, and debris N flowing on the reflective surface of the EUV condenser mirror 23 can be efficiently ejected to the outside of the chamber 2 from the shield pipe openings 87 of the shield pipes 72.

In addition, since one end of each intake pipe 70 is directed at the plasma generation region 25, the ions S generated in the plasma generation region 25 and the etching gas X can be efficiently taken in the intake pipes 70.

Moreover, neutralized ions S and/or a reaction product generated by collision and/or reaction between the ions S and the etching gas X can be ejected to the outside of the chamber 2 through the intake pipes 70.

This can suppress the diffusion of debris N in the chamber 2. This can suppress deposition of debris N on the reflective surface of the EUV condenser mirror 23. Meanwhile, the etching gas X can promote the etching of the reflective surface of the EUV condenser mirror 23.

[18. Ports and Ejection Paths Included in EUV Light Generation device According to Modification 2 of Fourth Embodiment]

[18.1 Configuration]

The configurations of the ports 80 and the ejection paths 81 included in an EUV light generation device 1 according to Modification 2 of the fourth embodiment will be described referring to FIG. 15.

Figure 15:
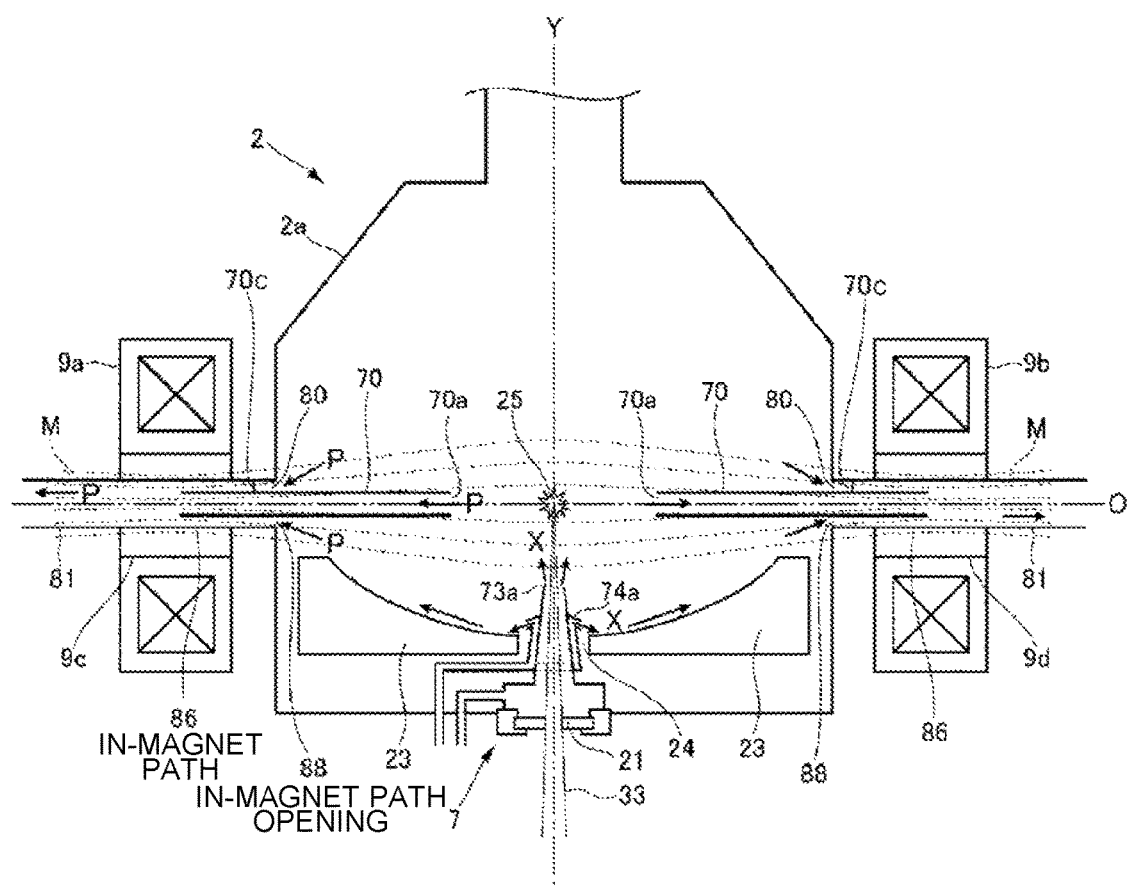
FIG. 15 is a diagram for explaining a configuration of an EUV light generation device according to Modification 2 of the fourth embodiment.

Here, FIG. 15 is a diagram for explaining the configuration of the EUV light generation device 1 according to Modification 2 of the fourth embodiment.

As in the EUV light generation device 1 according to Modification 3 of the first embodiment illustrated in FIG. 6, the ejection paths 81 may pass through the magnet bores 9c and 9d in the EUV light generation device 1 according to Modification 2 of the fourth embodiment.

In the EUV light generation device 1 according to Modification 2 of the fourth embodiment, the intake pipes 70 may be in communication with part of the ports 80.

The configurations of the ports 80, the ejection paths 81, the ejection device 82, and the magnetic field forming device 9 according to Modification 2 of the fourth embodiment may be similar to those in the EUV light generation device 1 according to Modification 3 of the first embodiment illustrated in FIG. 6.

The description of the components of the EUV light generation device 1 according to Modification 2 of the fourth embodiment which are similar to those in the EUV light generation device 1 illustrated in FIG. 6 will be omitted.

The chamber 2 may include intake pipes 70 and in-magnet paths 86 for taking in suspended substances P generated in the chamber 2.

As illustrated in FIG. 15, the intake pipe 70 may take in suspended substances P from one end, i.e., the inlet 70*a*. The intake pipe 70 may particularly take in ions S generated in the plasma generation region 25 and the etching gas X from the inlet 70*a*.

The ions S taken into the intake pipes 70 from the inlets 70*a* may collide and/or react with the etching gas X which is also taken into the intake pipes 70. Accordingly, the ions S may become neutralized ions S and/or a reaction product while going through the intake pipes 70.

As illustrated in FIG. 15, the in-magnet paths 86 may pass through the magnet bores 9*c* and 9*d* of the magnets 9*a* and 9*b*.

As illustrated in FIG. 15, the in-magnet path 86 may be disposed surrounding the end of the intake pipe 70 opposite to the inlet 70*a*. The in-magnet paths 86 may be provided such that in-magnet path openings 88 are provided at the ends of the in-magnet paths 86. The in-magnet path openings 88 may serve as part of the ports 80.

To be specific, the intake pipes 70 may be held coaxially with the in-magnet paths 86 in the in-magnet paths 86 having an inner diameter larger than the outer diameter of the intake pipes 70. Each intake pipe 70 may be held in the in-magnet path 86 with a plate-like or rod-like holder 70*c*.

The holder 70*c* may hold the intake pipe 70 and the in-magnet path 86 separated so that the gas can easily flow in the longitudinal direction of the in-magnet path 86. The holder 70*c* may be provided in more than one portion.

The in-magnet paths 86 may take in suspended substances P from the in-magnet path openings 88. The in-magnet paths 86 may particularly take in debris N floating around the reflective surface of the EUV condenser mirror 23, a product of reaction between debris N and the etching gas, and the etching gas X not reacting with debris N from the in-magnet path openings 88.

The configurations of the other components of the EUV light generation device 1 according to Modification 2 of the fourth embodiment may be similar to those in the EUV light generation device 1 according to Modification 3 of the first embodiment illustrated in FIG. 6.

[18.2 Effect]

Since the in-magnet path 86 has the in-magnet path opening 88 which is a space adjacent to the intake pipe 70, the flow of the gas ejected from the chamber 2 to the outside can be promoted in a portion where the magnetic lines of force M converge.

Consequently, the etching gas X, stannane gas, and debris N flowing on the reflective surface of the EUV condenser mirror 23 can be efficiently ejected to the outside of the chamber 2 from the in-magnet path openings 88 of the intake pipes 70.

In addition, since one end of each intake pipe 70 is directed at the plasma generation region 25, the ions S generated in the plasma generation region 25 and the etching gas X can be efficiently taken in the intake pipes 70.

Moreover, neutralized ions S and/or a reaction product generated by collision and/or reaction between the ions S and the etching gas X can be ejected to the outside of the chamber 2 through the intake pipes 70.

This can suppress the diffusion of debris N in the chamber 2. This can suppress deposition of debris N on the reflective surface of the EUV condenser mirror 23. Meanwhile, the etching of the reflective surface of the EUV condenser mirror 23 using the etching gas X can be promoted.

[19. Ports and Ejection Path Included in EUV Light Generation Device According to Modification 3 of Fourth Embodiment]

[19.1 Configuration]

The configurations of the ports 80 and the ejection path 81 included in an EUV light generation device 1 according to Modification 3 of the fourth embodiment will be described referring to FIGS. 16A and 16B.

Figure 16A:
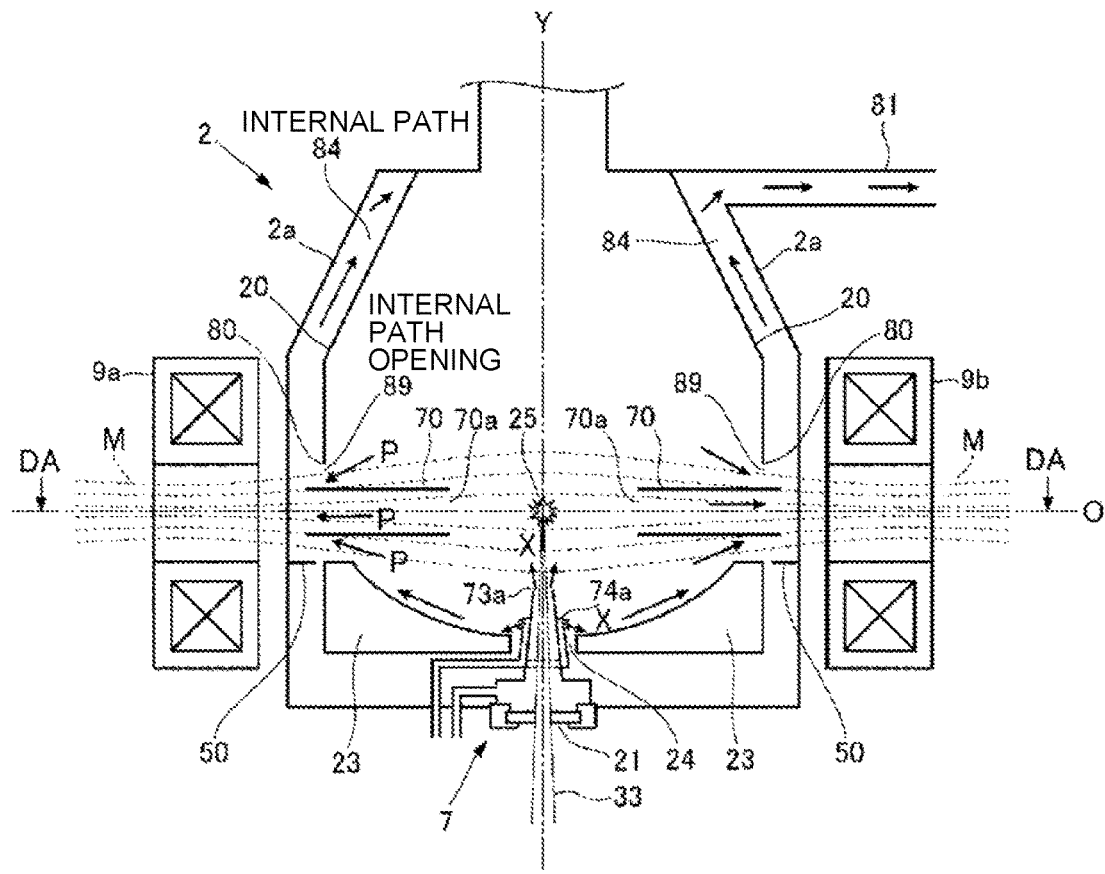
FIG. 16A is a diagram for explaining a configuration of an EUV light generation device according to Modification 3 of the fourth embodiment.

Here, FIG. 16A is a diagram for explaining the configuration of the EUV light generation device 1 according to Modification 3 of the fourth embodiment.

Figure 16B:
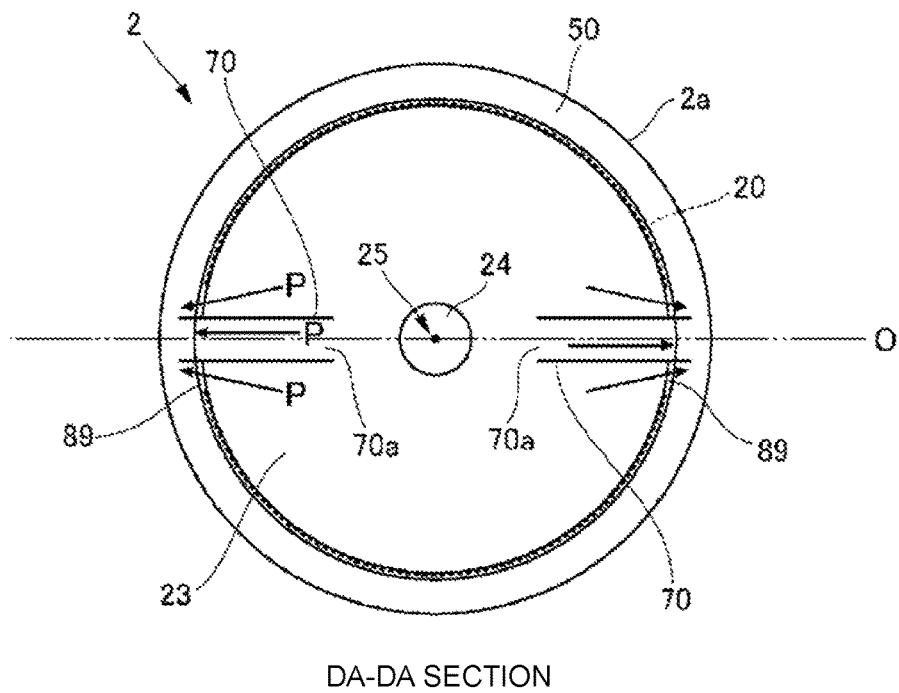
FIG. 16B is a cross-sectional view along a line DA-DA of the chamber illustrated in FIG. 16A.

FIG. 16B is a cross-sectional view along a line DA-DA of the chamber illustrated in FIG. 16A.

It should be noted that the gas supply unit 7 is omitted in FIG. 16B.

The EUV light generation device 1 according to Modification 3 of the fourth embodiment may differ from the EUV light generation device 1 according to Modification 1 of the first embodiment illustrated in FIG. 4A in that the interior of the intake pipe 70 is in communication with the ports 80.

The configurations of the ports 80, the ejection path 81, the ejection device 82, and the magnetic field forming device 9 according to Modification 3 of the fourth embodiment may be similar to those in the EUV light generation device 1 according to Modification 1 of the first embodiment illustrated in FIG. 4A.

The description of the components of the EUV light generation device 1 according to Modification 3 of the fourth embodiment which are similar to those in the EUV light generation device 1 according to Modification 1 of the first embodiment illustrated in FIG. 4A will be omitted.

The chamber 2 may include intake pipes 70 for taking in suspended substances P generated in the chamber 2. In the chamber 2, an internal path 84 may be provided which is a predetermined space defined by the chamber wall 2*a*, the division wall 20, and the flange 50.

The internal path 84 may be part of the ejection path 81. The internal path 84 may take in suspended substances P generated in the chamber 2 and carry suspended substances P to an ejection device 82 not illustrated through the ejection path 81.

As in the fourth embodiment, the intake pipes 70 according to Modification 3 of the fourth embodiment may be provided in a region corresponding to the obscuration region Q of the reflective surface of the EUV condenser mirror 23.

As illustrated in FIG. 16A, the intake pipe 70 may take in suspended substances P from one end, i.e., the inlet 70*a*. The intake pipe 70 may particularly take in ions S generated in the plasma generation region 25 and the etching gas X from the inlet 70*a*.

The ions S taken into the intake pipes 70 from the inlets 70*a* may collide and/or react with the etching gas X which is also taken into the intake pipes 70. Accordingly, the ions S may become neutralized ions S and/or a reaction product while going through the intake pipes 70.

The division wall 20 may include the ports 80 provided in the division wall 20 as openings. In Modification 3 of the fourth embodiment, the end of the intake pipe 70 opposite to the inlet 70*a* may be inserted to the port 80.

As illustrated in FIG. 16A, the port 80 may be disposed surrounding the end of the intake pipe 70 opposite to the inlet 70*a*. Each port 80 may be disposed to have an internal path opening 89 adjacent to the intake pipe 70. The internal path openings 89 may serve as part of the ports 80.

To be specific, the intake pipes 70 may be held in the ports 80 having an inner diameter larger than the outer diameter of the intake pipes 70. Each intake pipe 70 may be held in the port 80 with a plate-like or rod-like holder 70*c* not illustrated as in Modification 1 of the fourth embodiment.

The holder 70*c* may hold the port 80 and the intake pipe 70 separated so that the gas can easily flow in the internal path opening 89. The holder 70*c* may be provided in more than one portion.

The internal path 84 may take in suspended substances P from the internal path openings 89. The internal path 84 may particularly take in debris N floating around the reflective surface of the EUV condenser mirror 23, a product of reaction between debris N and the etching gas X, and the etching gas X not reacting with debris N from the internal path openings 89.

As illustrated in FIG. 16B, the suspended substances P generated in the chamber 2 may be taken into the inlets 70*a* and the internal path openings 89. The suspended substances P taken into the inlets 70*a* and the internal path openings 89 may flow into the ejection path 81 via the internal path 84. Afterwards, the suspended substances P may flow toward the ejection device 82 not illustrated through the ejection path 81.

The configurations of the other components of the EUV light generation device 1 according to Modification 3 of the fourth embodiment may be similar to those in the EUV light generation device 1 illustrated in FIG. 4A.

The EUV light generation device 1 according to Modification 3 of the fourth embodiment may include gas introduction ports 75*a* and 75*b*, gas transfer pipes 76*a* and 76*b*, and gas inlets 77*a* and 77*b*, which are collectively called "the second etching gas supply unit" as explained in Modification 5 of the first embodiment.

In this case, "the first etching gas supply unit" and "the second etching gas supply unit" may be provided in a region corresponding to the obscuration region Q of the reflective surface of the EUV condenser mirror 23.

[19.2 Effect]

Since the chamber 2 has the internal path openings 89 which are spaces adjacent to the intake pipes 70, the flow of the gas ejected from the chamber 2 to the outside can be promoted in a portion where the magnetic lines of force M converge.

Consequently, the etching gas X, stannane gas, and debris N flowing on the reflective surface of the EUV condenser mirror 23 can be efficiently ejected to the outside of the chamber 2 from the internal path openings 89 of the intake pipes 70.

In addition, since one end of each intake pipe 70 is directed at the plasma generation region 25, the ions S generated in the plasma generation region 25 and the etching gas X can be efficiently taken in the intake pipes 70.

Moreover, neutralized ions S and/or a reaction product generated by collision and/or reaction between the ions S and the etching gas X can be ejected to the outside of the chamber 2 through the intake pipes 70.

This can suppress the diffusion of debris N in the chamber 2. This can suppress deposition of debris N on the reflective surface of the EUV condenser mirror 23. Meanwhile, the etching of the reflective surface of the EUV condenser mirror 23 using the etching gas X can be promoted.

Since the internal path openings 89 are provided, the flow rate of the gas ejected from the chamber 2 can be increased. Consequently, the suspended substances P in the chamber 2 can be efficiently ejected.

[20. Ports and Ejection Path Included in EUV Light Generation Device According to Modification 4 of Fourth Embodiment]

[20.1 Configuration]

The configurations of the ports 80 and the ejection path 81 included in an EUV light generation device 1 according to Modification 4 of the fourth embodiment will be described referring to FIGS. 17A to 17C.

Figure 17A:
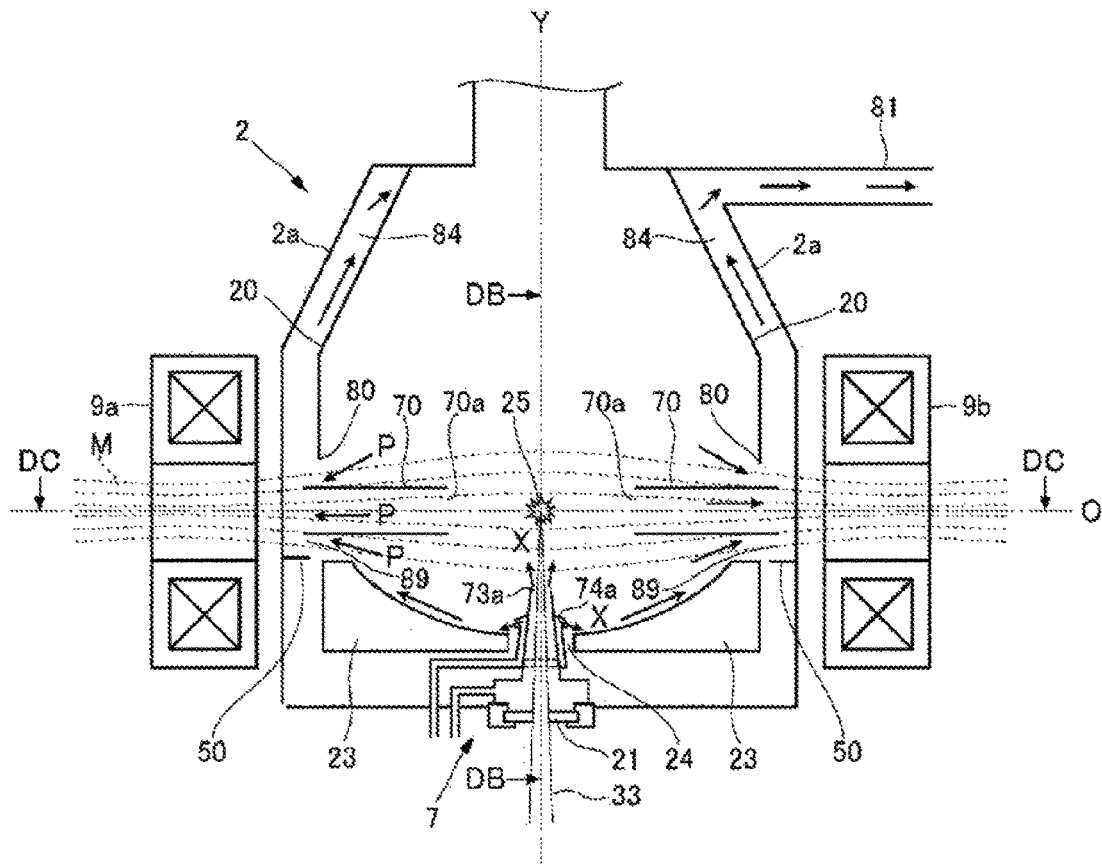
FIG. 17A is a diagram for explaining a configuration of an EUV light generation device according to Modification 4 of the fourth embodiment.

Here, FIG. 17A is a diagram for explaining the configuration of the EUV light generation device 1 according to Modification 4 of the fourth embodiment.

Figure 17B:
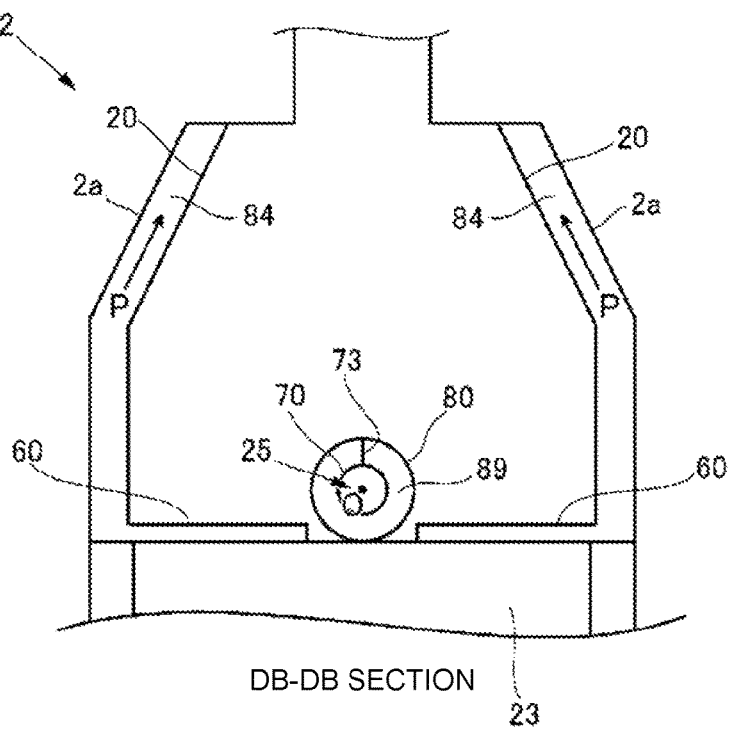
FIG. 17B is a cross-sectional view along a line DB-DB of the chamber illustrated in FIG. 17A.

FIG. 17B is a cross-sectional view along a line DB-DB of the chamber illustrated in FIG. 17A.

Figure 17C:
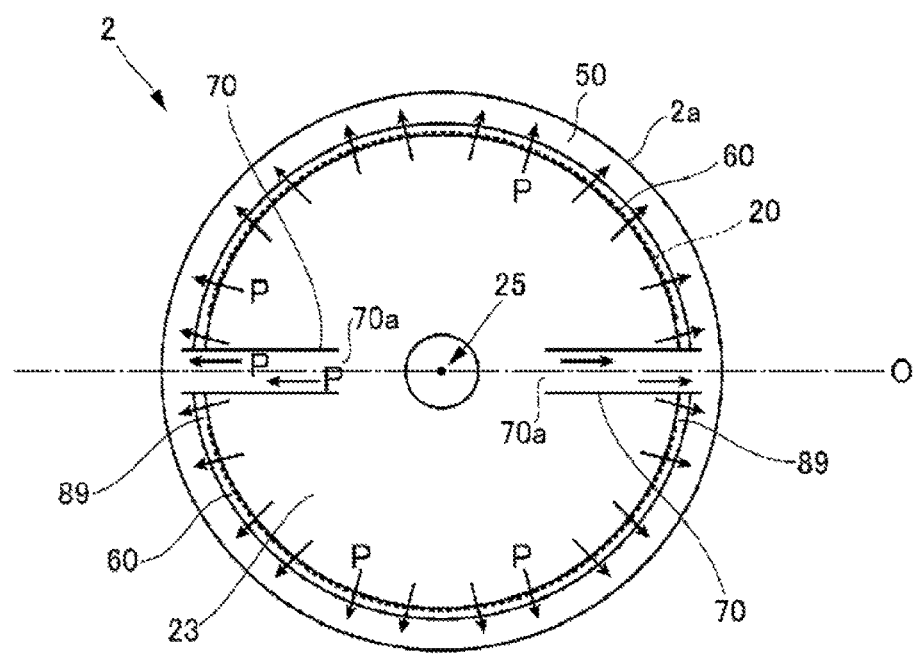
FIG. 17C is a cross-sectional view along a line DC-DC of the chamber illustrated in FIG. 17A.

FIG. 17C is a cross-sectional view along a line DC-DC of the chamber illustrated in FIG. 17A.

It should be noted that the gas supply unit 7 is omitted in FIGS. 17B and 17C.

The EUV light generation device 1 according to Modification 4 of the fourth embodiment may differ from the EUV light generation device 1 according to Modification 3 of the fourth embodiment illustrated in FIGS. 16A and 16B in that it includes slit openings 60 provided in the division wall 20 in the forms of slits.

The configurations of the intake pipes 70, the ports 80, the ejection path 81, the ejection device 82, the internal paths 84, and the magnetic field forming device 9 according to Modification 4 of the fourth embodiment may be similar to those in the EUV light generation device 1 according to Modification 3 of the fourth embodiment illustrated in FIGS. 16A and 16B.

The description of the components of the EUV light generation device 1 according to Modification 4 of the fourth embodiment which are similar to those in the EUV light generation device 1 illustrated in FIGS. 16A and 16B will be omitted.

As in the fourth embodiment, the intake pipes 70 according to Modification 4 of the fourth embodiment may be provided in a region corresponding to the obscuration region Q of the reflective surface of the EUV condenser mirror 23.

The intake pipes 70 may have ends directed at the chamber wall 2*a* side, partially inserted to the internal paths 84 via the ports 80, and therefore in communication with the ejection path 81.

As illustrated in FIG. 17B, the division wall 20 may have a plurality of openings provided on the inside wall surface: the ports 80 and the slit openings 60.

As illustrated in FIG. 17B, the port 80 may be disposed to have an internal path opening 89 adjacent to the intake pipe 70. The internal path openings 89 may serve as part of the ports 80.

Each intake pipe 70 may be held in the port 80 in a state partially inserted in the port 80 with a plate-like or rod-like holder 70*c* as in the configuration according to Modification 1 of the fourth embodiment.

The holder 70*c* may hold the intake pipe 70 separated from the peripheral edge of the opening of the port 80 so that the gas can efficiently flow in the internal path opening 89.

As illustrated in FIG. 17B, the division wall 20 may have the internal path openings 89 and the slit openings 60 that correspond to the second openings 80b according to the modification of the second embodiment and can take in suspended substances P.

As illustrated in FIGS. 17B and 17C, the suspended substances P generated in the chamber 2 may be taken into the inlets 70a of the intake pipes 70 and the internal path openings 89 and the slit openings 60 in the division wall 20.

Particularly ions S generated in the plasma generation region 25 and the etching gas X may be taken from the inlet 70a.

The ions S taken into the intake pipes 70 from the inlets 70a may collide and/or react with the etching gas X which is also taken into the intake pipes 70. Accordingly, the ions S may become neutralized ions S and/or a reaction product while going through the intake pipes 70.

Particularly debris N floating around the reflective surface of the EUV condenser mirror 23, a product of reaction between debris N and the etching gas X, and the etching gas X not reacting with debris N may be taken from the internal path openings 89 and the slit openings 60.

As illustrated in FIGS. 17A and 17B, the suspended substances P taken from the inlets 70a, the internal path openings 89, and the slit openings 60 may flow in the internal path 84. As illustrated in FIG. 17A, the suspended substances P flowing in the internal path 84 may flow toward the ejection device 82 not illustrated through the ejection path 81.

The EUV light generation device 1 according to Modification 4 of the fourth embodiment may include gas introduction ports 75a and 75b, gas transfer pipes 76a and 76b, and gas inlets 77a and 77b, which are collectively called "the second etching gas supply unit" as explained in Modification 5 of the first embodiment.

In this case, "the first etching gas supply unit" and "the second etching gas supply unit" may be provided in a region corresponding to the obscuration region Q of the reflective surface of the EUV condenser mirror 23.

[20.2 Effect]

With the slit openings 60, which are provided in the division wall 20 in the forms of slits along the edge of EUV condenser mirror 23, and the internal path openings 89, the etching gas X can flow on the entire surface of the EUV condenser mirror 23 substantially around the entire perimeter of the EUV condenser mirror 23 from the center to the edge.

Since the slit openings 60 are provided along the edge of EUV condenser mirror 23 in addition to the inlets 70a and the internal path openings 89, the flow rate of the etching gas X ejected to the outside of the chamber 2 can be increased. Consequently, the flow rate of the etching gas X injected to the chamber 2 can be increased. Thus, the gas containing suspended substances P in the chamber 2 can be efficiently ejected to the outside of the chamber 2.

Since the chamber 2 has the internal path openings 89 which are spaces adjacent to the intake pipes 70, the flow of the gas ejected from the chamber 2 to the outside can be promoted in a portion where the magnetic lines of force M converge.

Consequently, the etching gas X, stannane gas, and debris N flowing on the reflective surface of the EUV condenser mirror 23 can be efficiently ejected to the outside of the chamber 2 from the internal path openings 89 of the intake pipes 70.

In addition, since one end of each intake pipe 70 is directed at the plasma generation region 25, the ions S generated in the plasma generation region 25 and the etching gas X can be efficiently taken in the intake pipes 70.

Moreover, neutralized ions S and/or a product generated by collision and/or reaction between the ions S and the etching gas X can be ejected to the outside of the chamber 2 through the intake pipes 70.

This can suppress the diffusion of debris N in the chamber 2. This can suppress deposition of debris N on the reflective surface of the EUV condenser mirror 23. Meanwhile, the etching of the reflective surface of the EUV condenser mirror 23 using the etching gas X can be promoted.

In the vicinity of a portion where the magnetic lines of force M converge and ions S tend to build up, even ions S neutralized in the chamber 2 after colliding with the etching gas X without flowing into the inlets 70a can be collectively ejected from the internal path openings 89.

It should be understood by those skilled in the art that the techniques in the above-described embodiments including their modifications can be shared among them.

The above description should not be construed to be restrictive but illustrative only. Accordingly, it should be understood by those skilled in the art that modifications of the embodiments of the present disclosure can be made without departing from the attached claims.

The terms used throughout the description and the attached claims should be construed to be "non-restrictive". For example, the term such as "include" or "included" should be construed to mean "include, but should not be limited to". The term "have" should be construed to mean "have, but should not be limited to". The indefinite article "a" in the description and attached claims should be construed to mean "at least one" or "one or more".

What is claimed is:

1. An extreme ultraviolet light generation device comprising:
a chamber, in which extreme ultraviolet light is generated from plasma, the plasma having been generated by irradiation of a target supplied in a plasma generation region inside of the chamber with laser light;
a condenser mirror configured to collect the extreme ultraviolet light generated in the chamber and guide the extreme ultraviolet light to outside of the chamber;
a first etching gas supply unit configured to blow an etching gas to a reflective surface of the condenser mirror and the plasma generation region;
a magnet disposed outside of the chamber and configured to generate a magnetic field in the chamber;
a port that is disposed in a wall of the chamber, intersects a central axis of the magnetic field, and is configured to take in suspended substances generated in the chamber and a gas in the chamber, the wall residing between the magnet and the plasma generation region, the port including an opening in an inner wall of the chamber;
an ejection path that is formed along the wall of the chamber between the chamber and the magnet, is formed between the inner wall of the chamber and an outer wall of the chamber, is in communication with the port, and is configured to eject the suspended substances and the gas that are taken from the port to the outside of the chamber; and
an ejection device that is connected to the ejection path, and is configured to eject the suspended substances and the gas in the chamber.

2. The extreme ultraviolet light generation device according to claim 1, further comprising a transfer mechanism configured to move the chamber and the ejection path away from the magnet.

3. The extreme ultraviolet light generation device according to claim 1, wherein the suspended substances include at least a reaction product generated by reaction of ions emitted from the plasma and the etching gas.

4. The extreme ultraviolet light generation device according to claim 3, further comprising an intake pipe that is formed in the chamber so as to extend in a direction of the central axis of the magnetic field and configured to take in the suspended substances from one end facing the plasma generation region.

5. The extreme ultraviolet light generation device according to claim 4, further comprising a second etching gas supply unit configured to supply the etching gas from between a center and an outer edge of the reflective surface toward the outer edge of the reflective surface along the reflective surface, wherein
the first etching gas supply unit and the second etching gas supply unit are disposed in an obscuration region of the reflective surface.

6. The extreme ultraviolet light generation device according to claim 4, wherein the intake pipe is disposed in an obscuration region of the reflective surface.

7. The extreme ultraviolet light generation device according to claim 4, wherein the port is disposed in a portion where the etching gas flowing along the reflective surface is taken in.

8. The extreme ultraviolet light generation device according to claim 7, wherein
the inner wall intersects the central axis of the intake pipe extending in the direction of the central axis of the magnetic field, and the direction of the flow of the etching gas along the reflective surface, and
the other end of the intake pipe is in communication with the port with a gap between the other end of the intake pipe and an edge of the port.

9. The extreme ultraviolet light generation device according to claim 8, wherein the port includes an opening extending in a form of a slit along an outer edge of the reflective surface.

10. The extreme ultraviolet light generation device according to claim 1, wherein the ejection path is formed outside a wall of the chamber, the wall residing between the chamber and the magnet.

11. The extreme ultraviolet light generation device according to claim 1, wherein the ejection path is formed inside a wall of the chamber by a division wall disposed in the chamber.

12. The extreme ultraviolet light generation device according to claim 1, wherein the ejection path is formed in a wall of the chamber.

13. The extreme ultraviolet light generation device according to claim 1, wherein the ejection path includes a part of the wall of the chamber.

14. The extreme ultraviolet light generation device according to claim 1, further comprising:
a plurality of ports; and
a plurality of ejection paths that are respectively connected to the plurality of ports, and are linked in the chamber.

* * * * *